(12) United States Patent
Savant et al.

(10) Patent No.: US 11,374,114 B2
(45) Date of Patent: Jun. 28, 2022

(54) SEMICONDUCTOR DEVICE AND METHOD FOR FORMING THE SAME

(71) Applicant: TAIWAN SEMICONDUCTOR MANUFACTURING CO., LTD., Hsinchu (TW)

(72) Inventors: Chandrashekhar P. Savant, Hsinchu (TW); Tien-Wei Yu, Kaohsiung (TW); Ke-Chih Liu, Hsinchu (TW); Chia-Ming Tsai, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 30 days.

(21) Appl. No.: 16/829,614

(22) Filed: Mar. 25, 2020

(65) Prior Publication Data
US 2021/0305411 A1 Sep. 30, 2021

(51) Int. Cl.
*H01L 21/02* (2006.01)
*H01L 29/66* (2006.01)
*H01L 29/78* (2006.01)
*H01L 29/49* (2006.01)
*H01L 29/40* (2006.01)

(52) U.S. Cl.
CPC .... *H01L 29/66795* (2013.01); *H01L 21/0228* (2013.01); *H01L 21/02186* (2013.01); *H01L 29/401* (2013.01); *H01L 29/4966* (2013.01); *H01L 29/7851* (2013.01)

(58) Field of Classification Search
None
See application file for complete search history.

(56) References Cited

U.S. PATENT DOCUMENTS

2018/0145149 A1* 5/2018 Chiang ............... H01L 21/3115

OTHER PUBLICATIONS

Logothetidis et al., "Room temperature oxidation behavior of TiN thin fims". Thin Solid Films 338 (1999) 304-313. (Year: 1999).*

* cited by examiner

*Primary Examiner* — Asok K Sarkar
(74) *Attorney, Agent, or Firm* — Maschoff Brennan

(57) ABSTRACT

A high-k dielectric layer is formed over a semiconductor substrate having a first trench and a second trench. A barrier layer is formed over the high-k dielectric layer. A work function layer is deposited over the barrier layer, and is patterned and removed from the second trench, exposing the barrier layer at the second trench. A precursor is deposited selectively over the barrier layer in the second trench, and deposited over the work function layer in the first trench. The precursor selectively reacts with the barrier layer to selectively etch the barrier layer, and selectively reacts with the work function layer to selectively etch a top oxidized portion of the work function layer and deposit a protective layer. The reaction products between the precursor and the barrier layer, and the reaction products between the precursor and the work function layer are removed by using an inert gas.

20 Claims, 53 Drawing Sheets

SEMICONDUCTOR DEVICE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Semiconductor devices generally have metal gate electrodes arranged over channel regions and work function layers. The work function layers can be tuned according to the type of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
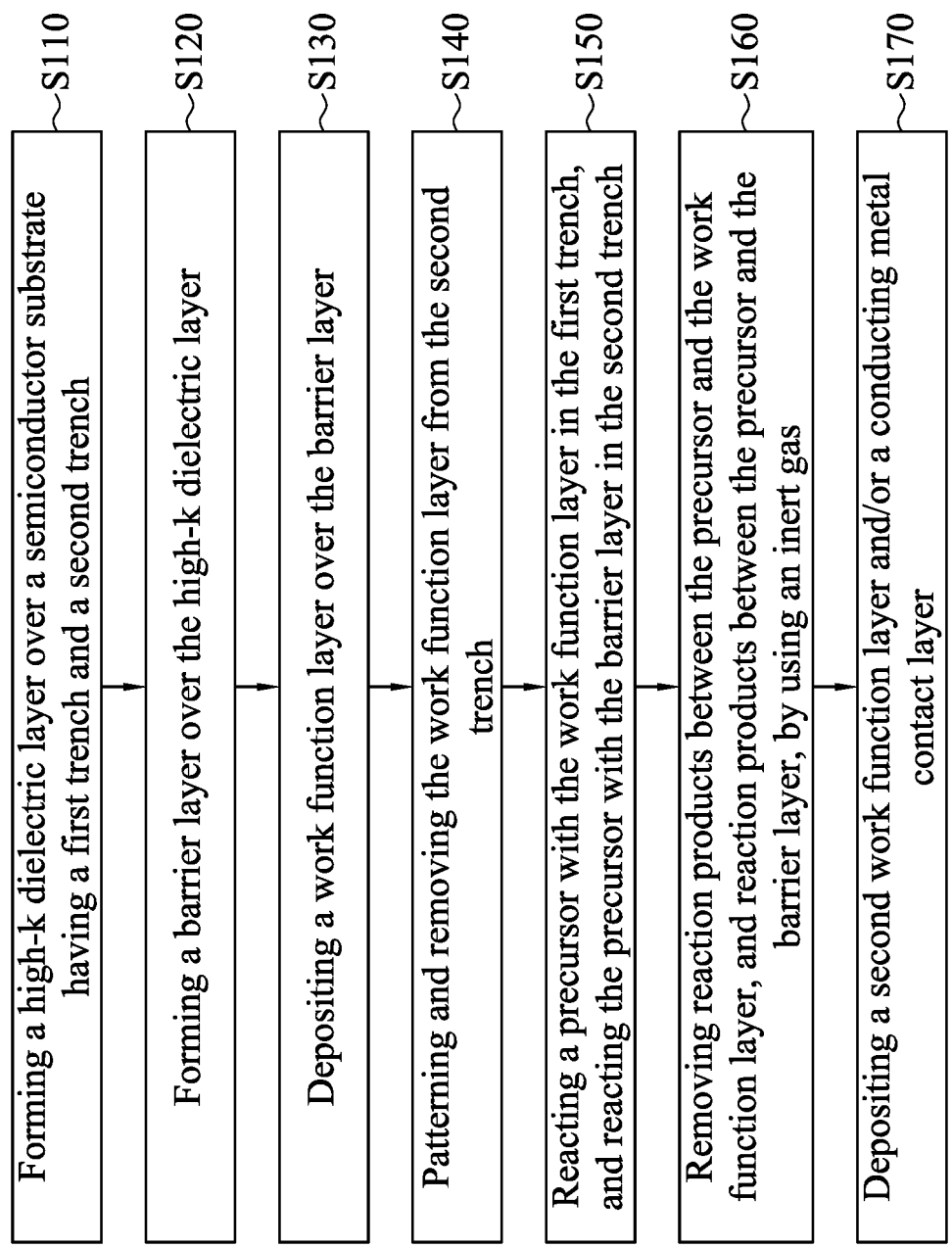
FIG. 1 shows a flowchart of a method for forming a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure relates to methods of reacting a precursor with a work function layer and/or with a barrier layer and/or with a high-k dielectric layer. Specifically, the present disclosure relates to methods of performing substrate selective atomic layer etching of barrier layers, substrate selective atomic layer etching of a top oxidized part of work function layers, and/or substrate selective deposition on work function layers.

FIG. 1 shows a flowchart of a method for forming a semiconductor device according to some embodiments of the present disclosure. In step S110, a high-k dielectric layer is formed over a semiconductor substrate having a first trench and a second trench. In step S120, a barrier layer is formed over the high-k dielectric layer. In step S130, a work function layer is blanket deposited over the barrier layer. In step S140, the work function layer is patterned and removed from the second trench using photolithography processes and wet etching. In step S150, a precursor reacts with the work function layer in the first trench, and reacts with the barrier layer in the second trench. Thereby, selective etching of an oxidized part of the work function layer and co-deposition of a precursor based layer is carried out on the work function layer in the first trench, and selective etching of the barrier layer is carried out in the second trench. In some embodiments, the precursor is deposited on the high-k dielectric layer in the second trench. In step S160, reaction products of the precursor and the work function layer are removed by using an inert gas in the first trench. In some embodiments, reactions products of the precursor and the barrier layer are removed by using the inert gas in the second trench. In step S170, a second work function layer and/or a conducting metal contact layer is deposited. In some embodiments, the second work function layer and/or the conducting metal contact layer is deposited over the work function layer. In some embodiments, the second work function layer and/or the conducting metal contact layer is deposited over the barrier layer or the high-k dielectric layer.

Figure 2A:
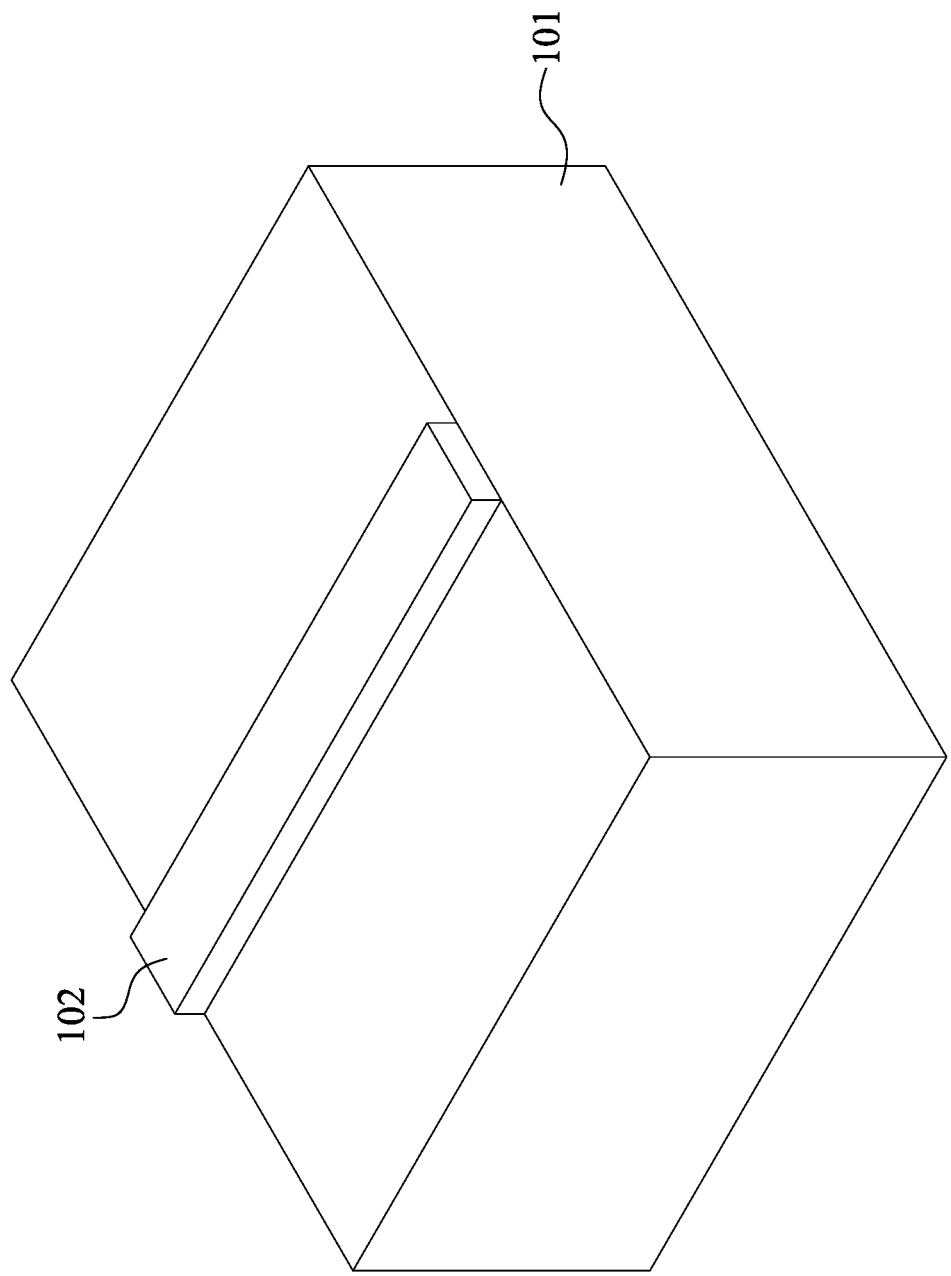
FIGS. 2A-2O show perspective views at various stages of a method for forming a semiconductor device according to some embodiments of the present disclosure.
Figure 2B:
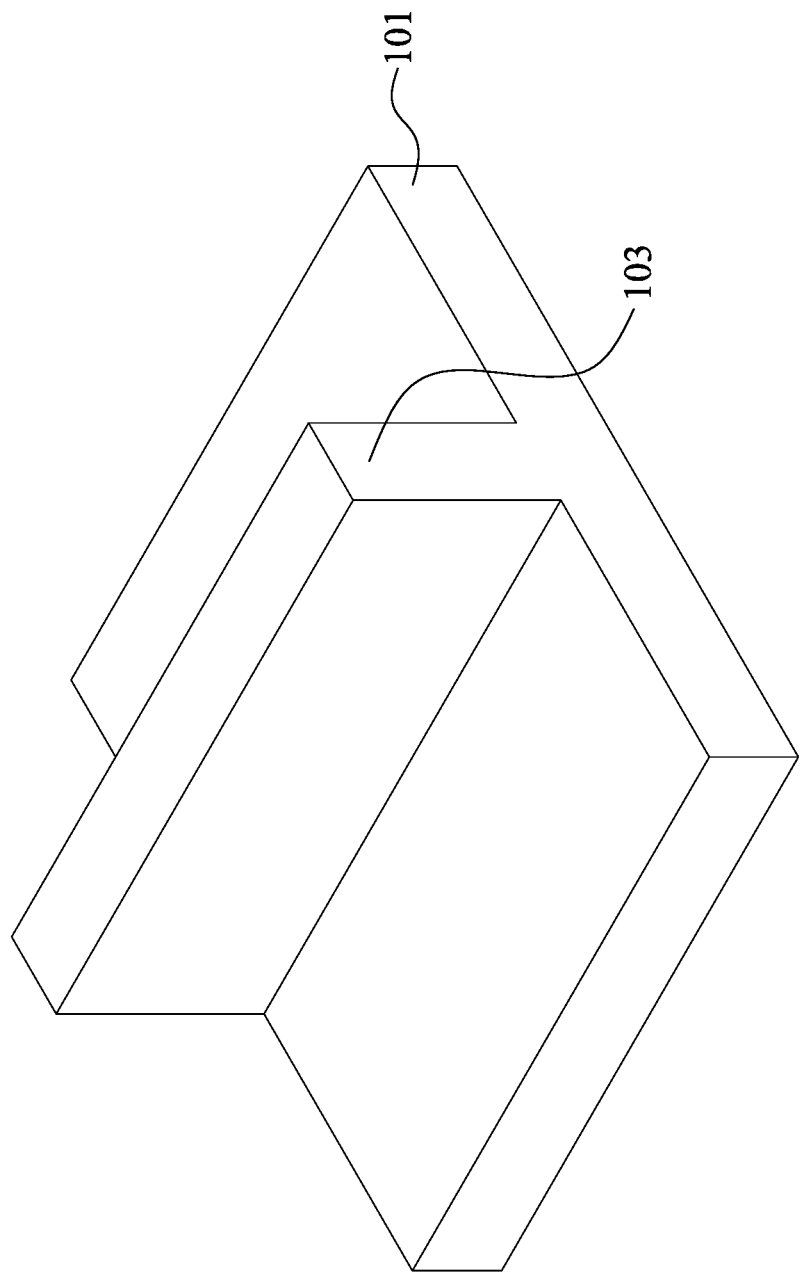

Embodiments of the present disclosure can be applied to work function layers, barrier layers, and high-k dielectric layers deposited on fin structures, deposited on nanowire structures, or deposited on nanosheet structures, or deposited on nanoforksheet structures. FIGS. 2A-2O show perspective views at various stages of a method for forming a semiconductor device according to some embodiments of the present disclosure. As shown in FIG. 2A, a semiconductor substrate 101 is provided in accordance with some embodiments. The semiconductor substrate 101 may be a semiconductor wafer such as a silicon wafer. Alternatively or additionally, semiconductor substrate 101 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the semiconductor substrate 101 may include structures such as doped regions, interlayer dielectric (ILD) layers, conductive features, and/or isolation structures. Furthermore, the semiconductor substrate 101 may further include single or multiple material layers to be patterned. For example, the material layers may include a silicon layer, a dielectric layer, and/or a doped poly-silicon layer. A photoresist layer 102 is formed over the semiconductor substrate 101 and patterned. As shown in FIG. 2B, the patterned photoresist layer 102 and the substrate are etched, and a fin structure 103 is formed. The photoresist layer 102 is then removed.

Figure 2C:
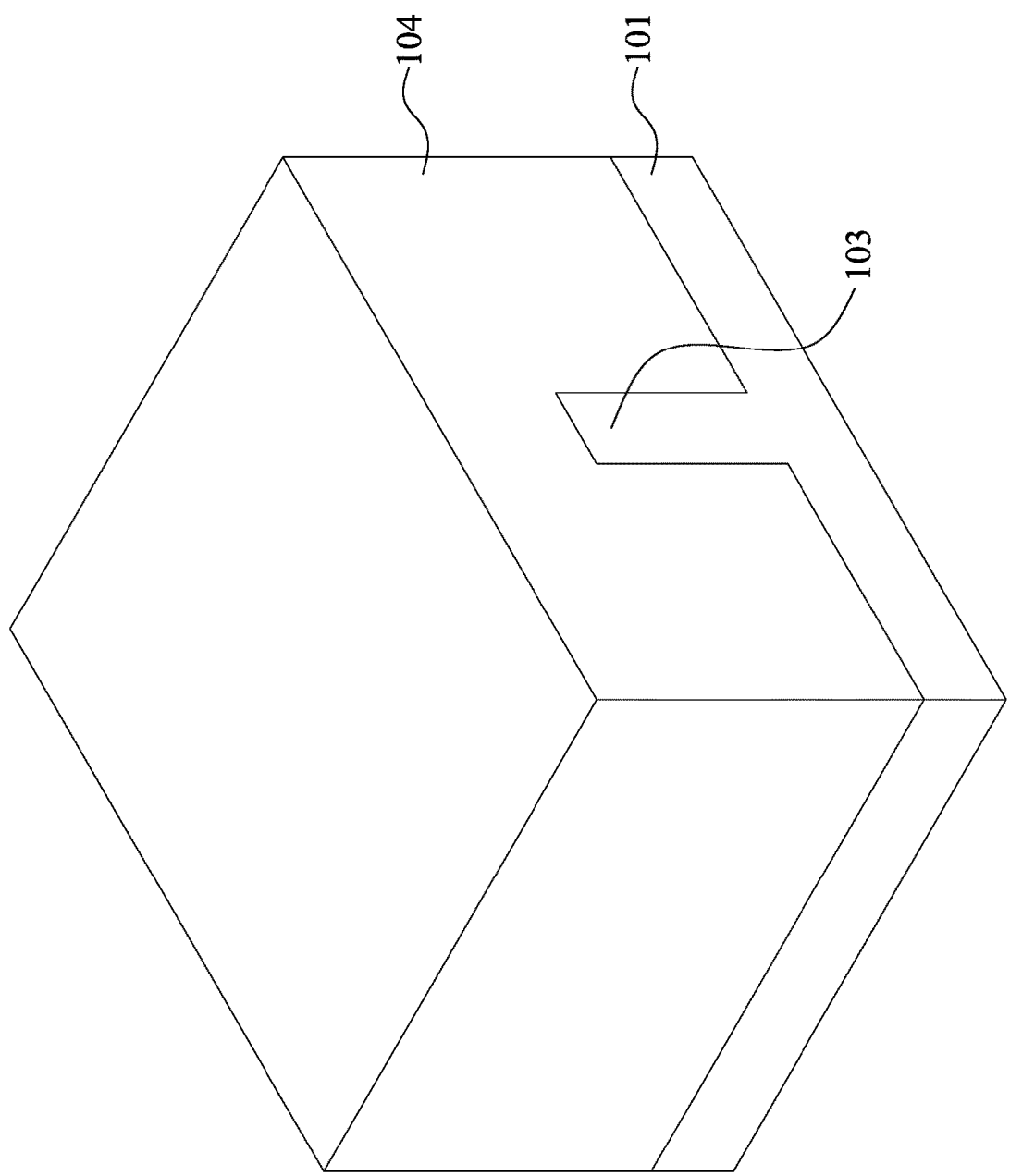

As shown in FIG. 2C, after the photoresist layer 102 is removed, an insulating layer 104 is formed to cover the fin structure 103. In some embodiments, the insulating layer 102 is made of silicon oxide, silicon nitride, silicon oxynitride, fluoride-doped silicate glass (FSG), or other low-k dielectric materials. The insulating layer 104 may be formed by using a high-density-plasma (HDP) CVD process, although other deposition processes may be used in other embodiments.

Figure 2D:
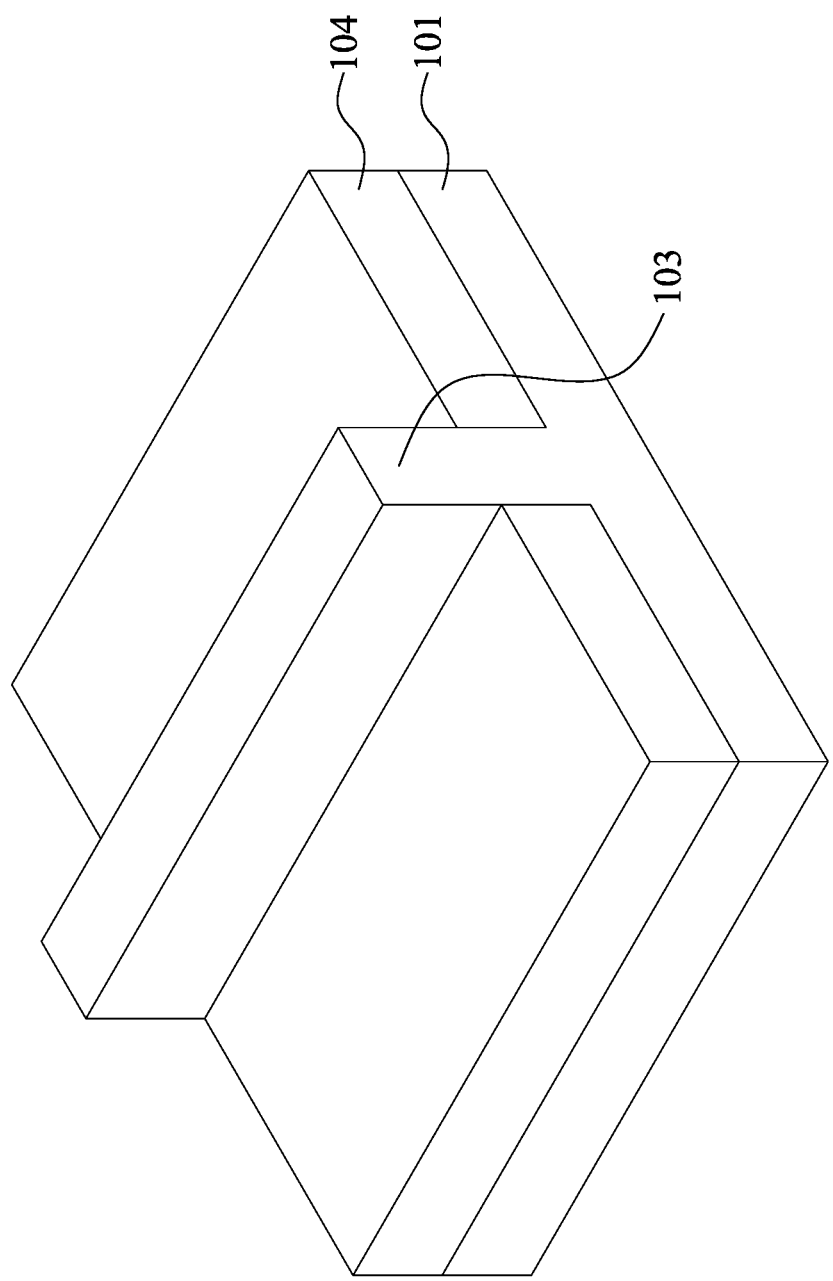

As shown in FIG. 2D, after the insulating layer 104 is formed, a chemical mechanical polishing (CMP) process is performed on the insulating layer 104, and an etching process is further performed on the insulating layer 104 such that the insulating layer 104 is recessed to expose the top portion of the fin structure 103. The insulating layer 104 may be seen as shallow trench isolation (STI) structures.

Figure 2E:
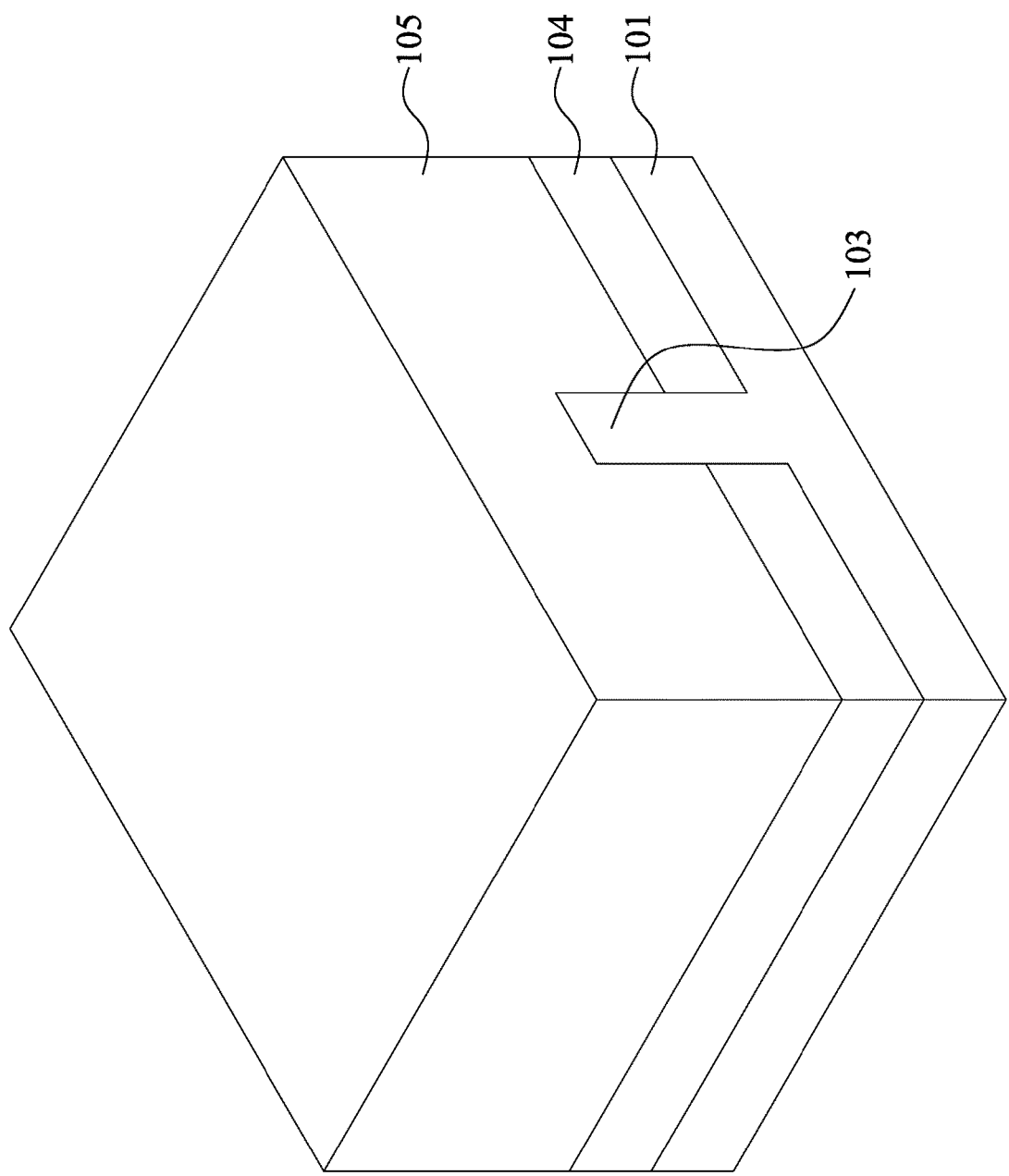

As shown in FIG. 2E, a sacrificial layer 105 is formed over the semiconductor substrate 101 to cover the fin structure 103 and the insulating layer 104. The sacrificial layer 105 may be formed by a deposition processes, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). The sacrificial layer 106 may be made of conductive or non-conductive materials, such as metals, silicon containing materials, or dielectric materials.

Figure 2F:
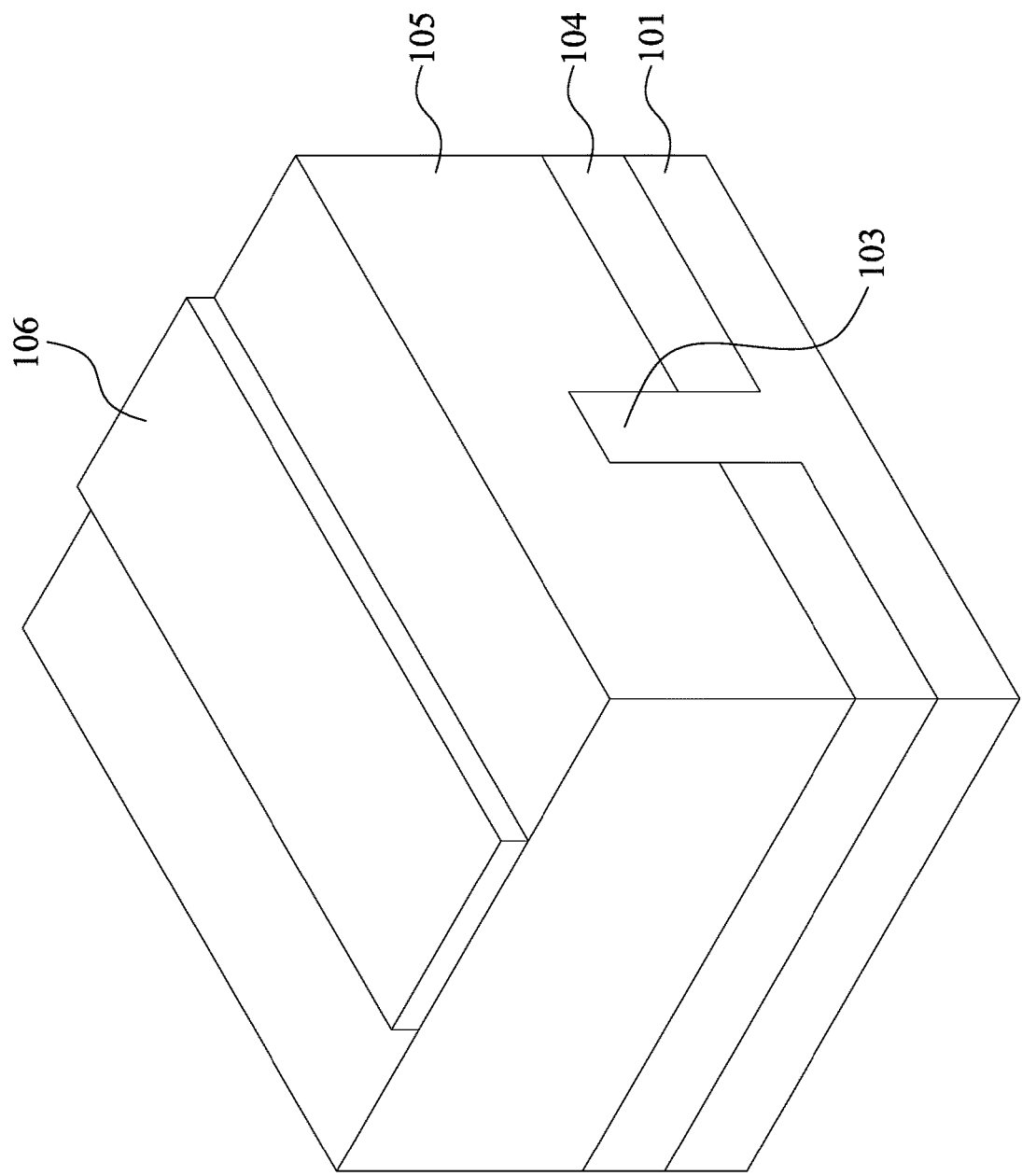
Figure 2G:
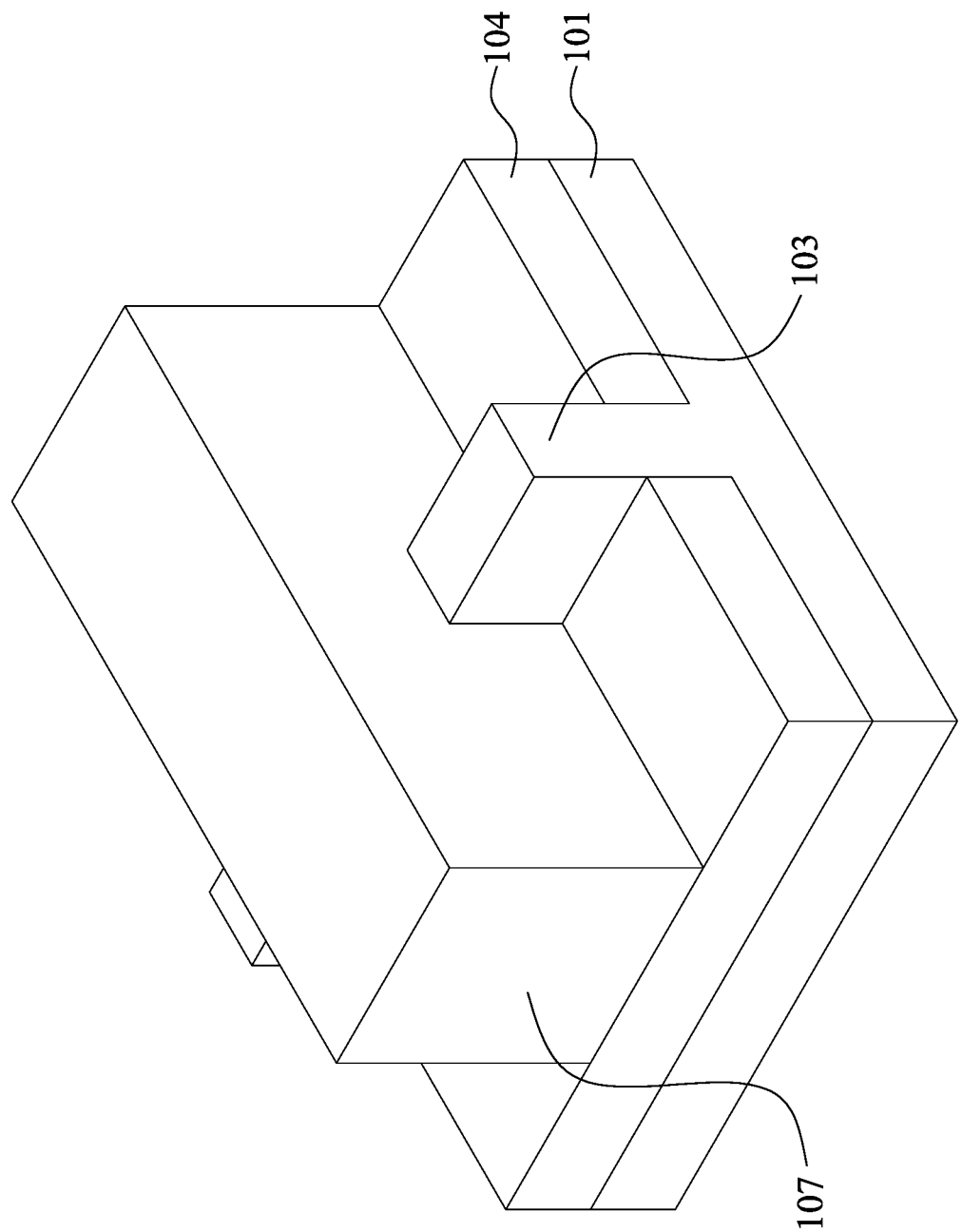

Next, the sacrificial layer 105 is patterned and etched to form a dummy gate structure 107. More specifically, another photoresist layer 106 is formed over the sacrificial layer 105 and patterned, as shown in FIG. 2F. Then, as shown in FIG. 2G, an etching process is performed to form the dummy gate structure 107, and the photoresist layer 106 is removed after the etching process. The dummy gate structure 107 includes portions of the sacrificial layer 105.

Figure 2H:
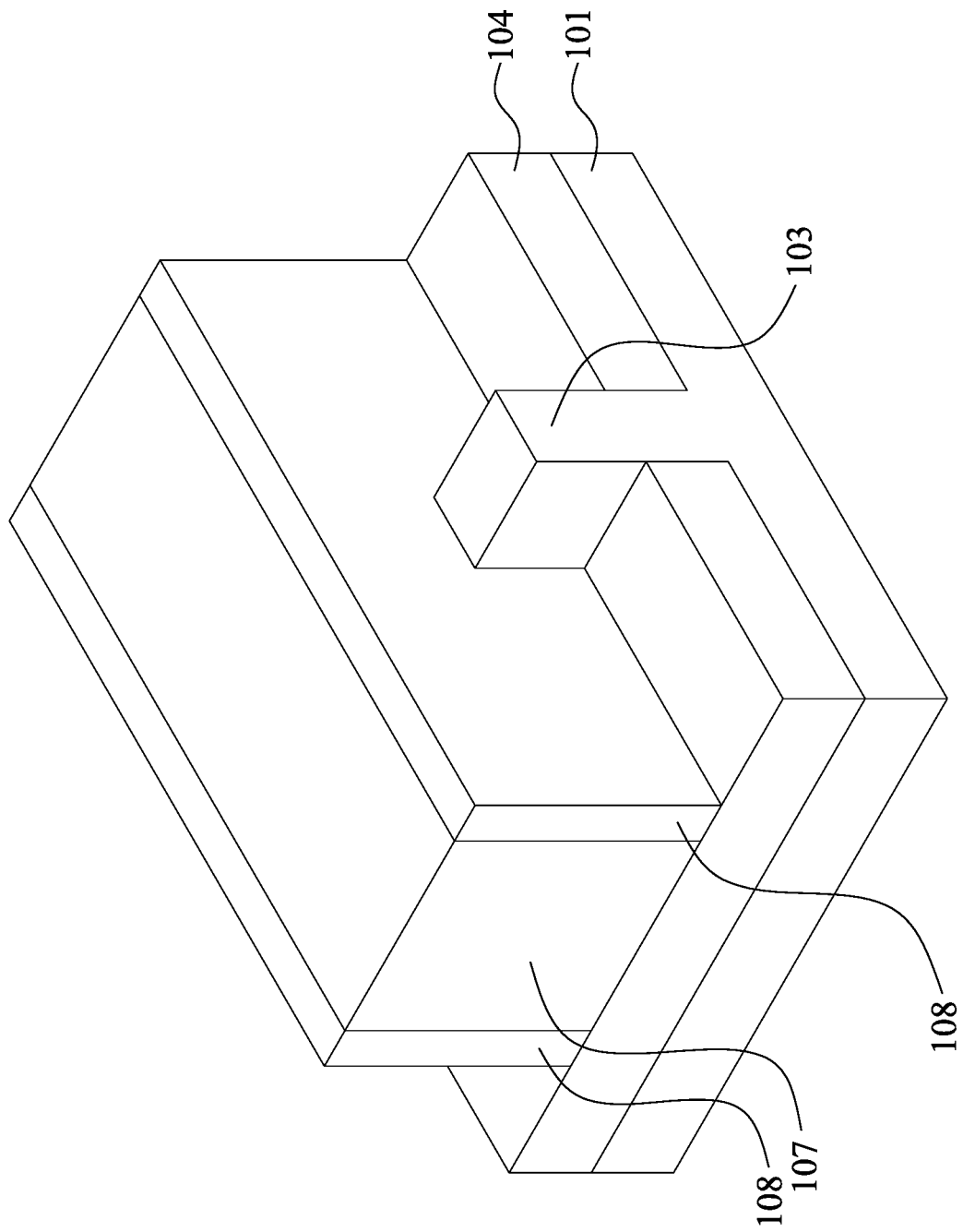

As shown in FIG. 2H, after the dummy gate structure 107 is formed, spacers 108 are formed on the sidewalls of the dummy gate structure 107. In some embodiments, the spacers 108 are made of silicon nitride, silicon carbide, silicon oxynitride, silicon carbon, silicon oxide, silicon hydrogen, other applicable materials, or a combination thereof. The spacers 108 may be formed by deposition and etching processes.

When the spacers 108 are formed on the fin structure 103 and the insulating layer 104 at the sidewall of the dummy gate structure 107, the spacers 108 are in direct contact with the fin structure 103 and the insulating layer 104.

Figure 2I:
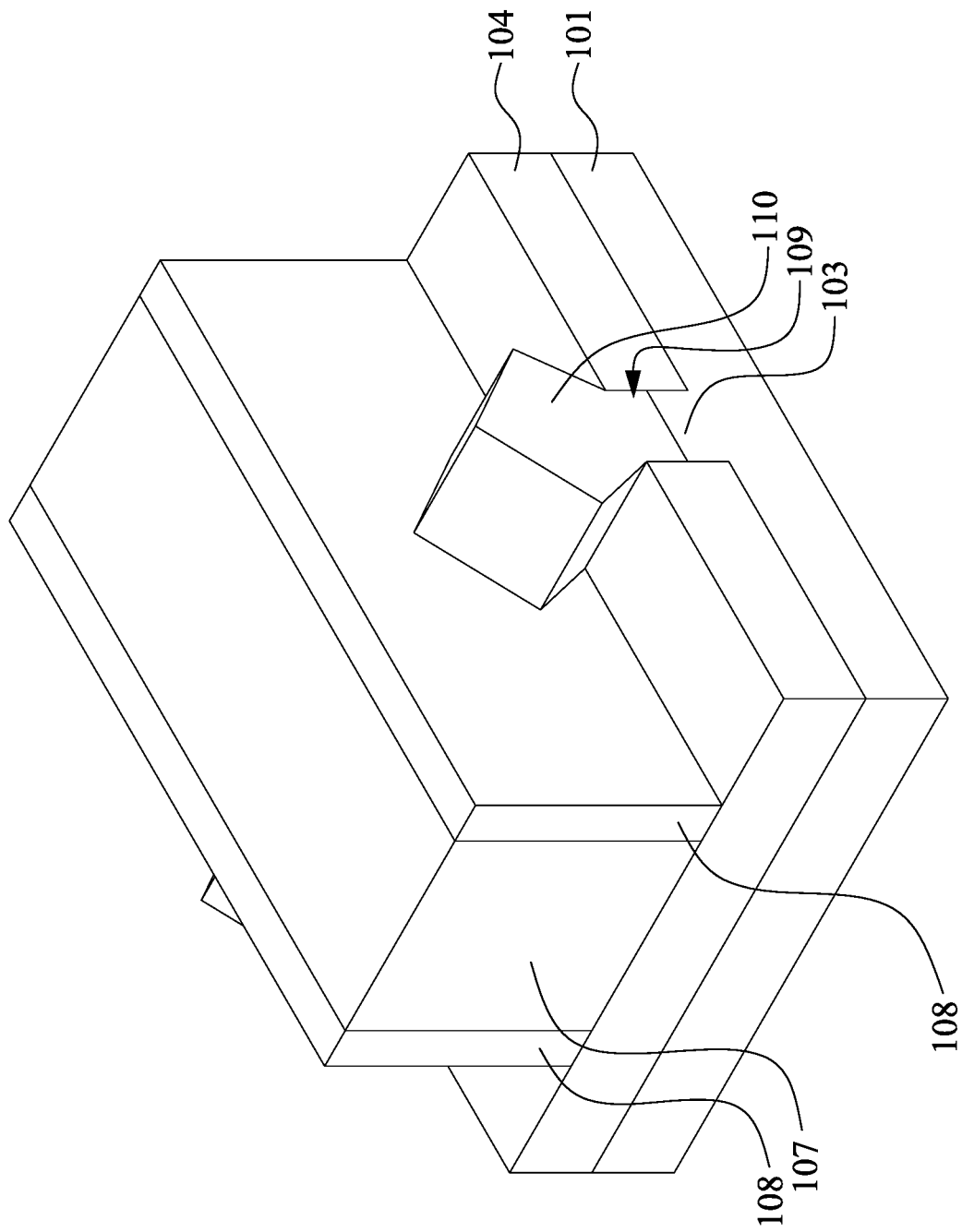

As shown in FIG. 2I, recesses 109 are formed in the fin structure 103 on the sides of the spacers 108 facing away from the dummy gate structure 107. After the recesses 109 are formed in the fin structure 103, epitaxy structures 110 (source/drain structures) are formed in the recesses 109. In some embodiments, the epitaxy structures 110 are strained source/drain structures. In some embodiments, the epitaxy structures 110 are formed by growing a strained material in the recesses 109 by an epitaxial process. In addition, the lattice constant of the strained material may be different from the lattice constant of the semiconductor substrate 101. In some embodiments, the epitaxy structures 110 include Ge, SiGe, InAs, InGaAs, InSb, GaAs, GaSb, InAlP, InP, or a combination thereof.

Figure 2J:
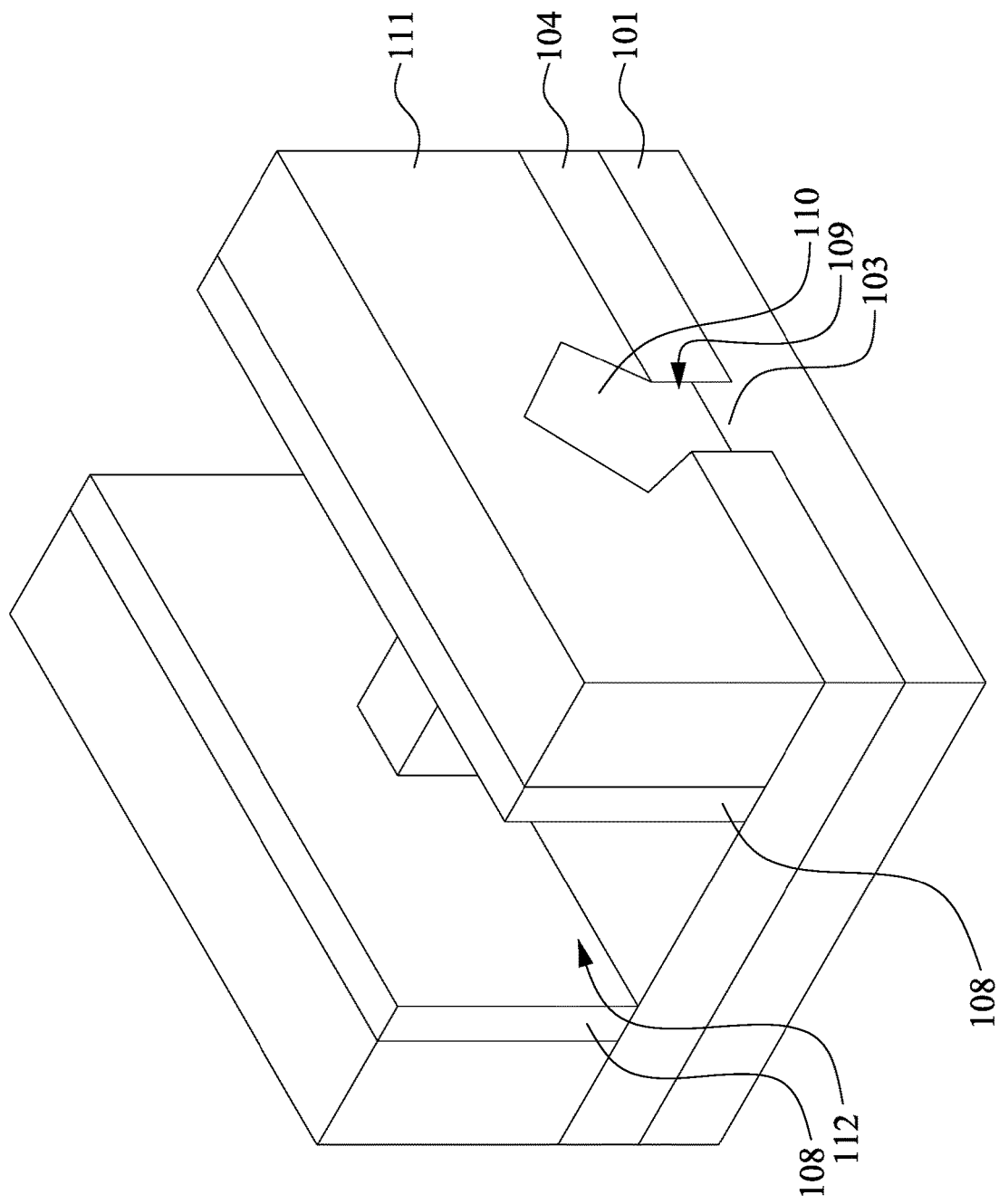

As shown in FIG. 2J, an inter-layer dielectric (ILD) layer 111 is formed over the epitaxy structure 103 and the insulating layer 104, and polished by chemical mechanical polishing (CMP). The inter-layer dielectric layer 111 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric layer 111 may be formed by chemical vapor deposition (CVD), physical vapor deposition, (PVD), atomic layer deposition (ALD), spin-on coating, or other applicable processes.

Then, the dummy gate structure 107 is etched away, leaving behind a first trench 112A. In some embodiments, the etching process includes using an etching gas such as $CF_4$, Ar, $NF_3$, $Cl_2$, He, HBr, $O_2$, $N_2$, $CH_3F$, $CH_4$, $CH_2F_2$, or a combination thereof. In some embodiments, the etching process is performed at a temperature in a range from about 20° C. to about 80° C. In some embodiments, the etching process is performed at a pressure in a range from about 1 mtorr to about 100 mtorr. In some embodiments, the etching process is performed at a power in a range from about 50 W to about 1500 W. At other regions of the semiconductor wafer, a similar device structure is formed by the same process, leaving behind a second trench 112B.

Figure 2K:
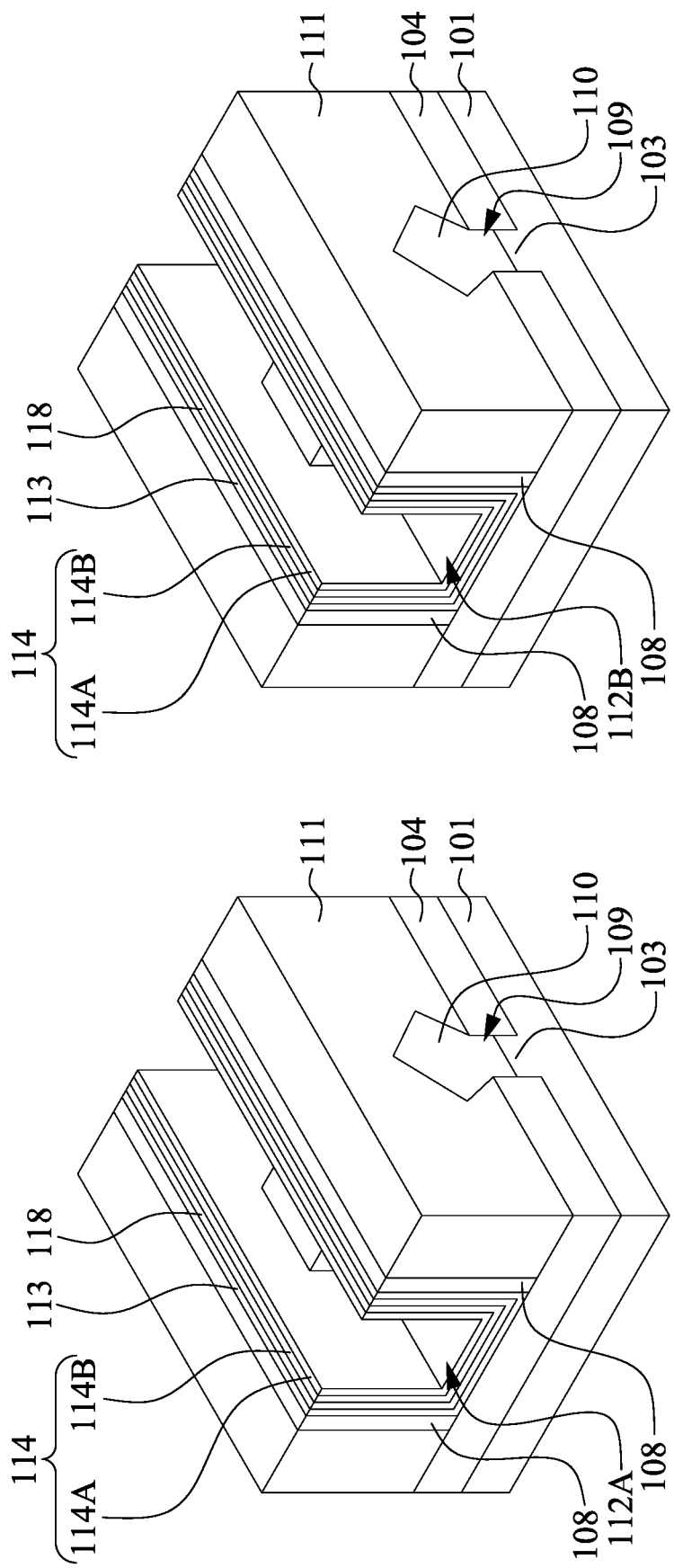

As shown in FIG. 2K, after the dummy gate structure 107 is removed, a high-k dielectric layer 113, a barrier layer 118, and a work function layer 114 are formed in the first trench 112A and the second trench 112B. In some embodiments, the high-k dielectric layer 113 is made of metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium lanthanum oxide ($HfLaO_x$), hafnium silicon oxide ($HfSiO_x$), hafnium silicon oxynitride (HfSiON), hafnium tantalum oxide ($HfTaO_x$), hafnium titanium oxide ($HfTiO_x$), hafnium zirconium oxide ($HfZrO_x$), silicon nitride, silicon oxynitride, zirconium oxide, titanium oxide, aluminum oxide, hafnium dioxide-alumina ($HfO_2$—$Al_2O_3$) alloy, or other applicable dielectric materials.

The barrier layer 118 is formed in the first trench 112A and the second trench 112B after the formation of the high-k dielectric layer 113 and prior to the formation of the work function layer 114, such that the barrier layer 118 is between the high-k dielectric layer 113 and the work function layer 114. In some embodiments, the barrier layer 118 is made of tantalum oxynitride, tantalum nitride, or combinations thereof.

The work function layer 114 is formed over the high-k dielectric layer 113 and the barrier layer 118. The work function layer 114 may be tuned to have a proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten carbo nitride (WCN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), tantalum aluminide (TiAl), tantalum aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

Figure 2L:
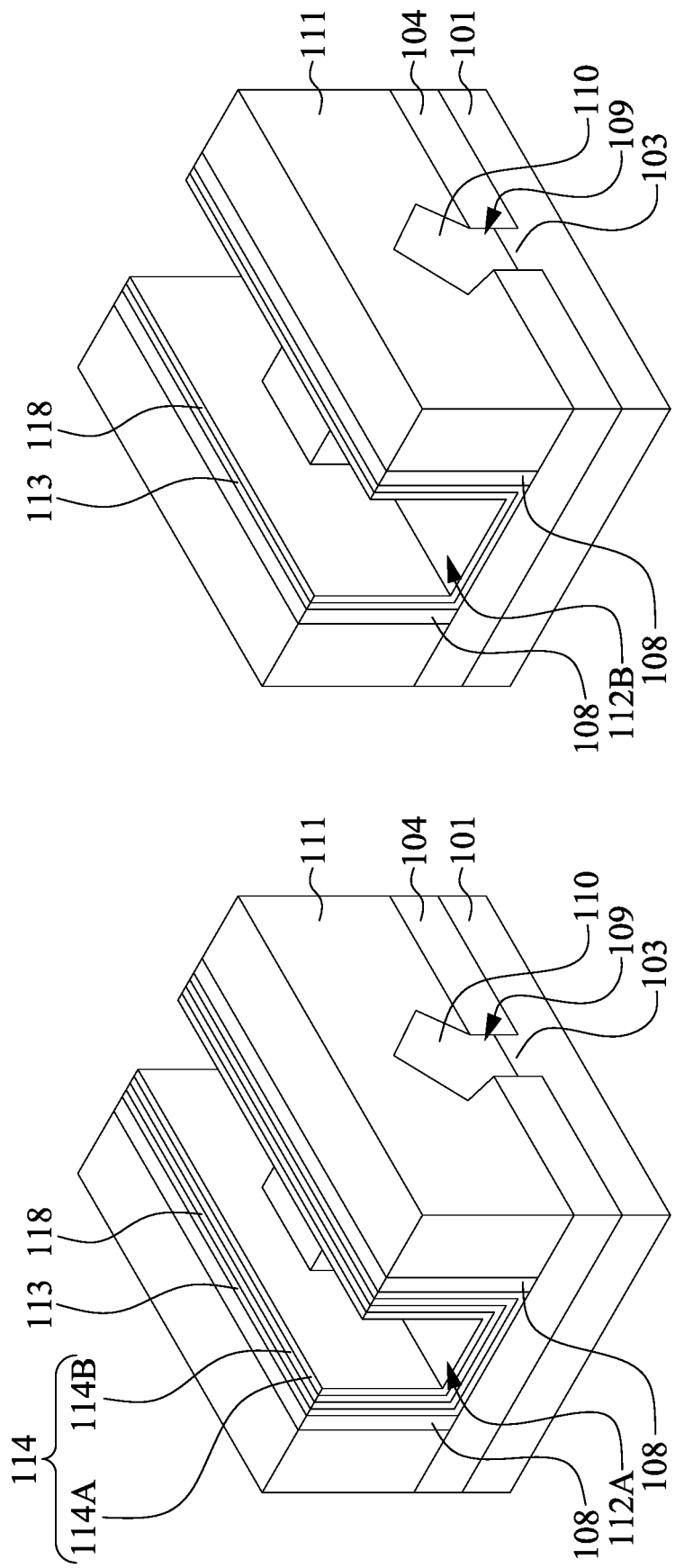
Figure 2M:
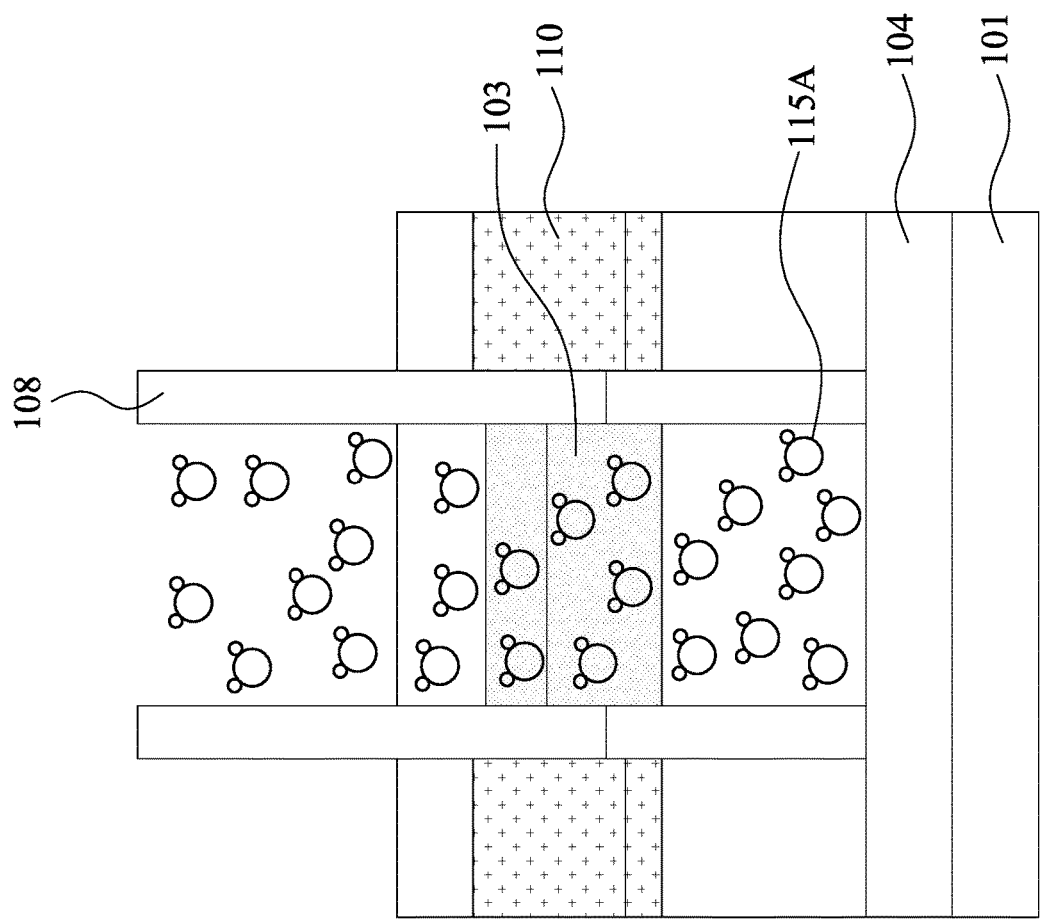

The work function layer 114 is then removed from the second trench 112B, such that the barrier layer 118 thereunder is exposed. As shown in FIG. 2L, the barrier layer 118 is exposed in the second trench 112B. As shown in FIG. 2M, in some embodiments of the present disclosure, precursor 115A can include fluoride compounds such as tungsten fluoride ($WF_6$), tantalum fluoride ($TaF_5$), and titanium fluoride ($TiF_4$), chloride compounds such as tungsten chloride ($WCl_5$), tantalum chloride ($TaCl_5$), and titanium chloride ($TiCl_4$), and/or $H_2$, $B_2H_6$, $SiH_4$, $BCl_3$, $O_2$, $NH_3$, Ar plasma. The precursor 115A can be deposited, reacted onto the work function layer 114 at the first trench 112A through substrate selective atomic layer etching and deposition (ALED), in which pulse and purge operations of one or more of the above precursor are cyclically repeated. The precursor 115A can be deposited, reacted onto the barrier layer 118 at the second trench 112B. In a pulse operation, the precursor 115A is introduced in gaseous form into a chamber accommodating the semiconductor substrate 101. At the first trench 112A, the precursor 115A attach to a top surface of the work function layer 114 to form a layer. In some embodiments this layer is one atom in height. Thereby, the surface adsorbed precursor layer 115 is formed over the work function layer 114, and reacts with the work function layer 114. At the second trench 112B, the precursor 115A attach to a top surface of the barrier layer 118 to form a layer which is one atom in height, and reacts with the barrier layer 118.

Figure 2N:
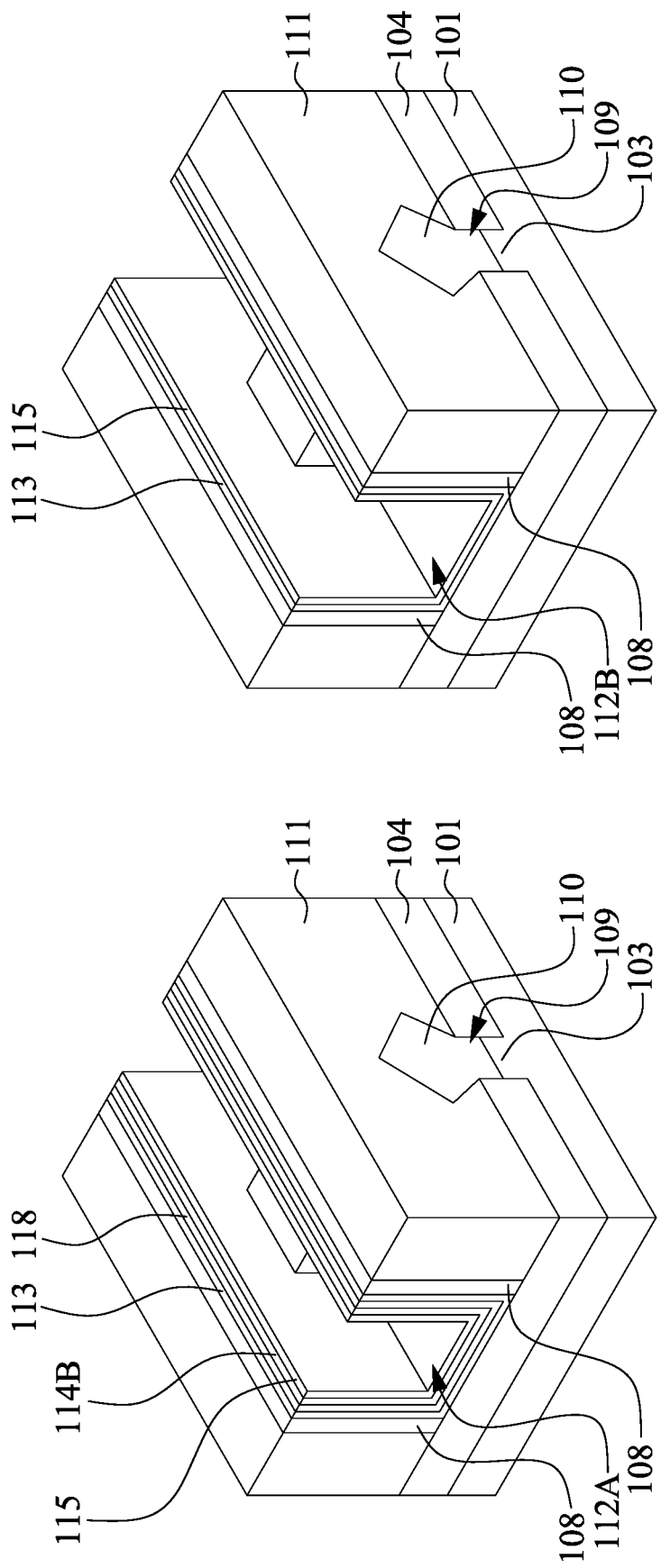
Figure 2O:
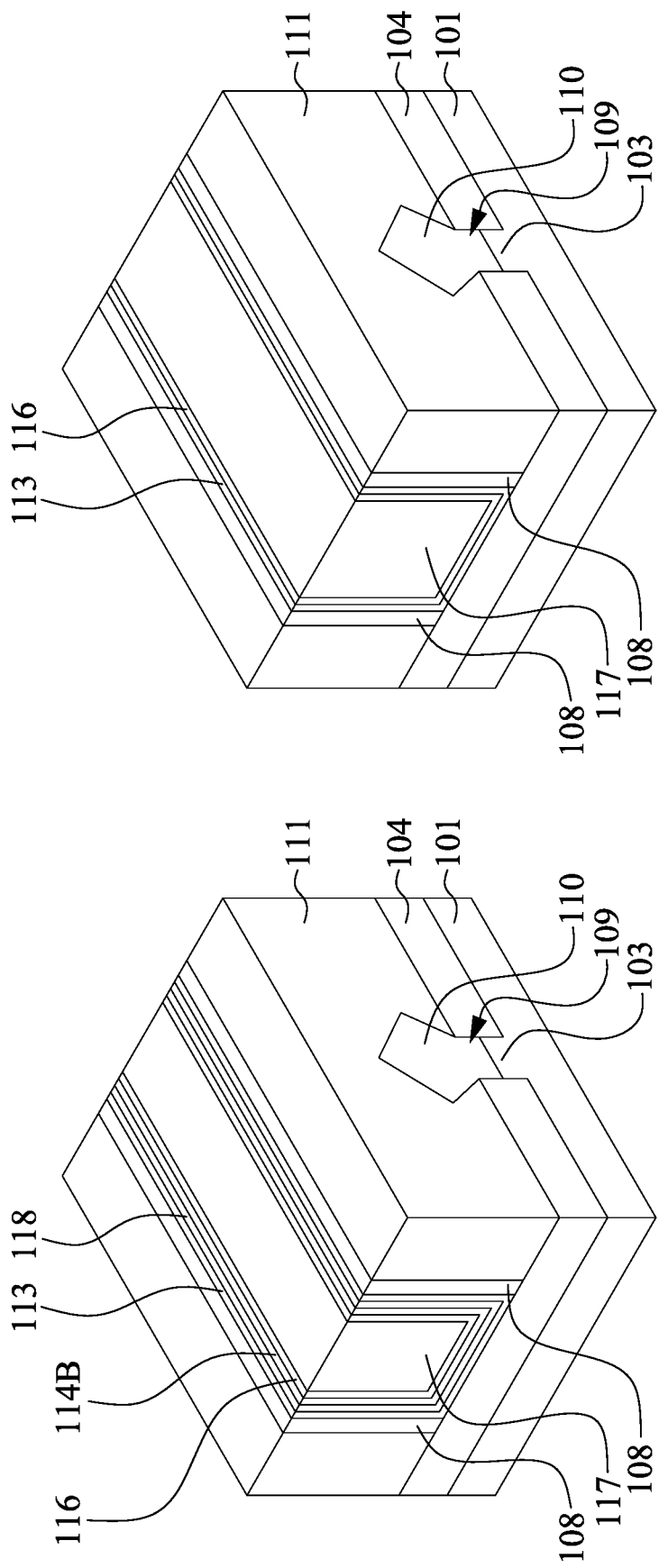

As shown in FIG. 2N, in some embodiments of the present disclosure, the surface adsorbed precursor layer 115 is formed on the work function layer 114 at the first trench 112A to react with the work function layer 114. In the second trench 112B, the work function layer 114 has been removed, and the surface adsorbed precursor layer 115 is formed on the exposed barrier layer 118 and reacts with the barrier layer 118, dissolving/etching off the barrier layer 118 thereat. In the purge operation, the reaction products from the reaction between the surface adsorbed precursor layer 115 and the work function layer 114 at the first trench 112A are removed by using a purge gas. The reaction products from the reaction between the surface adsorbed precursor layer 115 and the barrier layer 118 at the second trench 112B are removed by using the same purge gas. In some embodiments, the purge gas can include nitrogen gas and argon gas.

The precursor 115A can alternately include chloride compounds such as tungsten chloride, tantalum chloride, and titanium chloride. In some embodiments, the precursor 115A can be deposited onto the work function layer 114 at the first trench 112A through cyclically repeating a first pulse operation, a purge operation, a second pulse operation, and the purge operation. In the first pulse operation, the precursor 115A is introduced in gaseous form into a chamber accommodating the semiconductor substrate 101, and attaches to a top surface of the work function layer 114 to form the surface adsorbed precursor layer 115 thereon, in which the surface adsorbed precursor layer 115 is one atom in height. Thereby, the surface adsorbed precursor layer 115 is formed over the work function layer 114, and reacts with the work function layer 114. In a purge operation, the reaction products from the reaction between the surface adsorbed precursor layer 115 and the work function layer 114 are removed by using an inert gas. In the second pulse operation, an alternate precursor such as hydrogen or ammonia is introduced into the chamber accommodating the semiconductor substrate 101, such that chloride is removed from the work function layer 114. In the purge operation, the reaction products between hydrogen, ammonia, and chloride are removed by using an inert gas. The inert gas can include nitrogen gas and argon gas.

Either of the above cyclical processes can be repeated until a desirable amount of work function layer 114 at the first trench 112A is etched away, atom-layer by atom-layer. Specifically, a top oxidized portion 114A of the work function layer 114 shown in FIG. 2L is etched off. After the top oxidized portion 114A of the work function layer 114 has been removed, the precursor 115A introduced onto the work function layer 114 in subsequent pulse operations are then deposited thereon to form a protective layer 116 of FIG. 2O. As shown in FIG. 2O, the protective layer 116 is formed over a non-oxidized portion 114B of the work function layer 114. Thereafter, a metal gate electrode 117 is formed over the protective layer 116 and the non-oxidized portion 114B of the work function layer 114. In some embodiments, the metal gate electrode 117 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. At the second trench 112B, the work function layer 114 has been removed using patterning process to expose the barrier layer 118 thereunder, and the abovementioned pulse and purge operations are repeated until the exposed barrier layer 118 of FIG. 2L is etched away. Then, subsequent pulse operations can introduce the precursor 115A which is then deposited onto the high-k dielectric layer 113 to form the protective layer 116.

Figure 3:
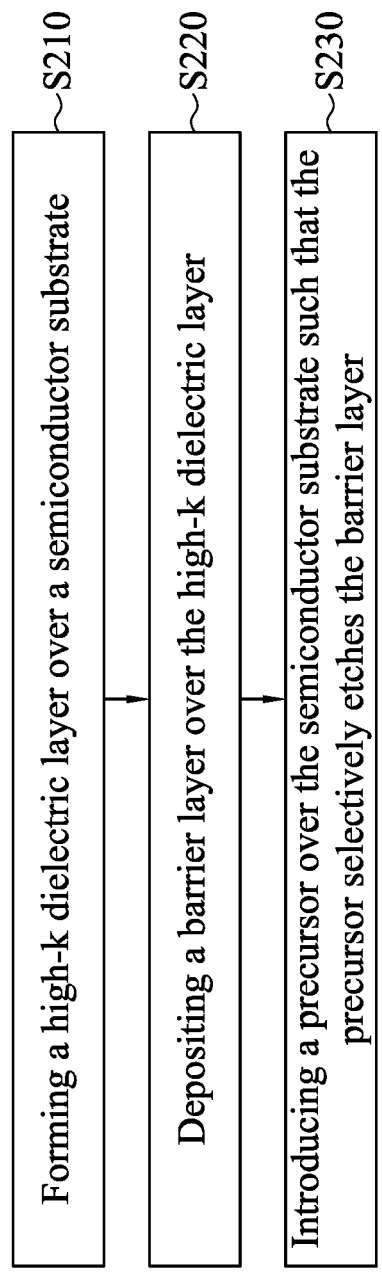
FIG. 3 shows a flowchart of a method for forming a semiconductor device according to some embodiments of the present disclosure.

FIG. 3 shows a flowchart of a method for forming a semiconductor device according to some embodiments of the present disclosure. In step S210, a high-k dielectric layer is formed over a semiconductor substrate. In step S220, a barrier layer is deposited over the high-k dielectric layer. In step S230, a precursor is introduced over the semiconductor substrate such that the precursor etches the barrier layer.

Figure 4:
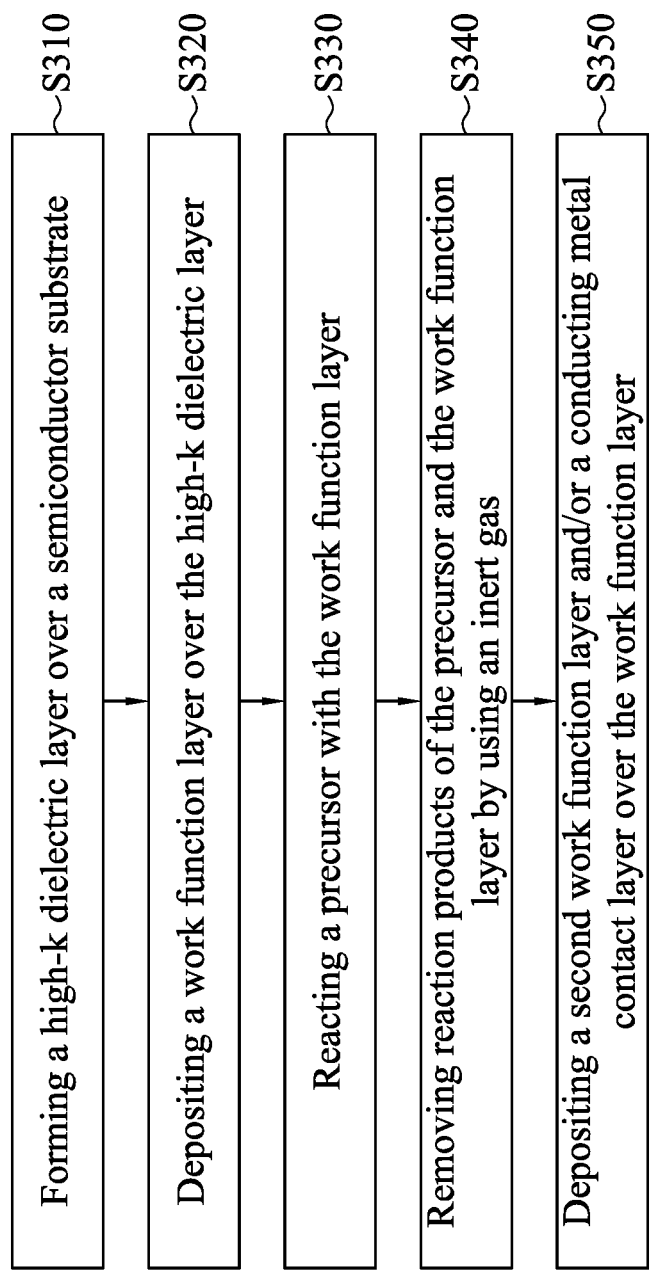
FIG. 4 shows a flowchart of a method for forming a semiconductor device according to some embodiments of the present disclosure.

FIG. 4 shows a flowchart of a method for forming a semiconductor device according to some embodiments of the present disclosure. In step S310, a high-k dielectric layer is formed over a semiconductor substrate. In some embodiments, a barrier layer is formed over the high-k dielectric layer. In step S320, a work function layer is deposited over the high-k dielectric layer. In step S330, a precursor reacts with the work function layer. Thereby, selective etching of a top oxidized part of the work function layer is carried out, and thereafter co-deposition of a surface adsorbed precursor layer is carried out on the work function layer. In step S340, reaction products of the precursor and the work function layer are removed by using an inert gas. In step S350, a second work function layer and/or a conducting metal contact layer is deposited over the work function layer.

Figure 5A:
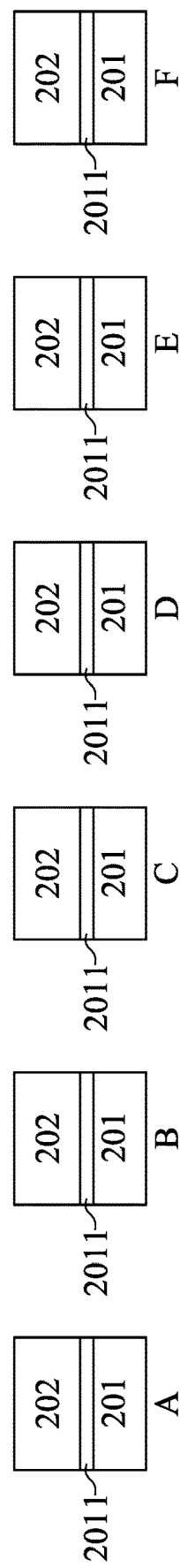
FIGS. 5A-5M show schematic diagrams at various stages of a method for forming semiconductor devices according to some embodiments of the present disclosure.
Figure 5B:
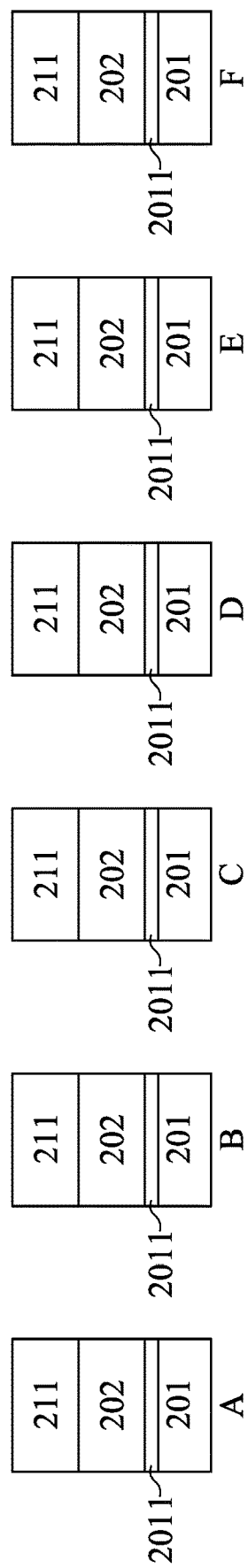
Figure 5C:
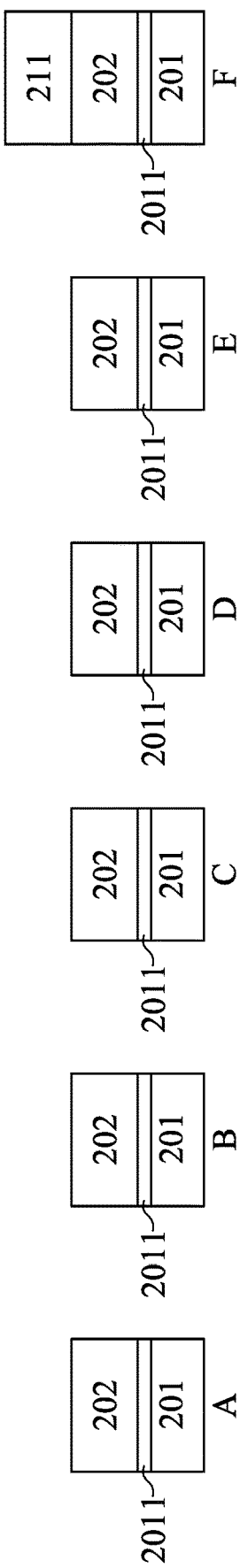
Figure 5D:
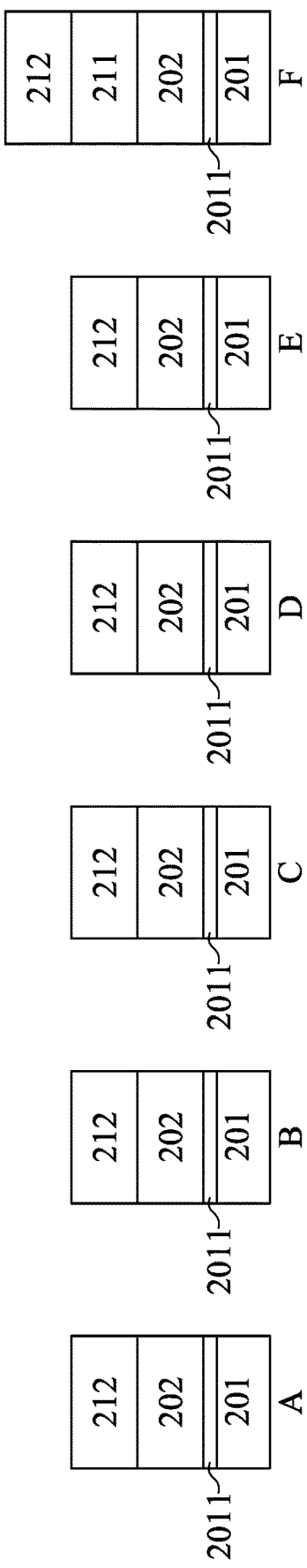
Figure 5E:
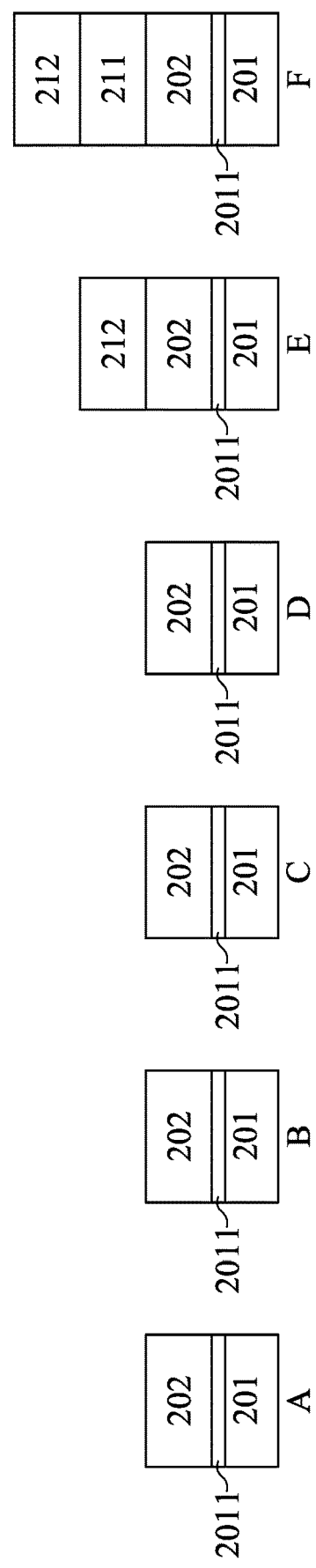
Figure 5F:
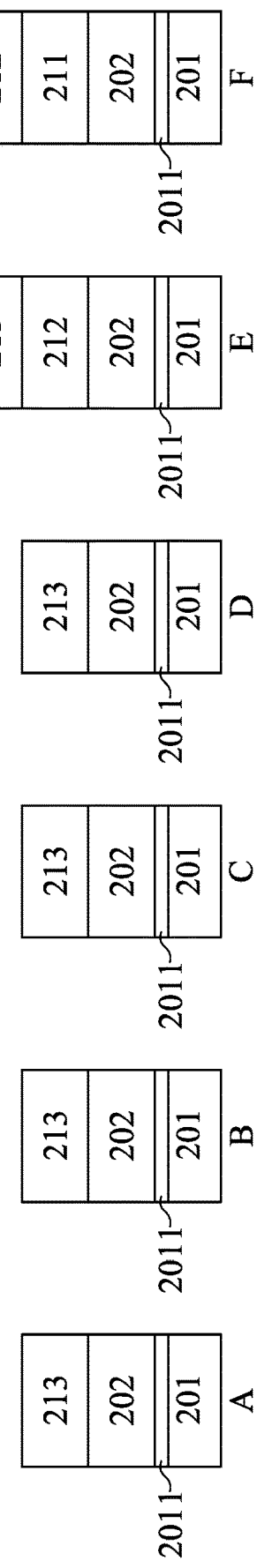
Figure 5G:
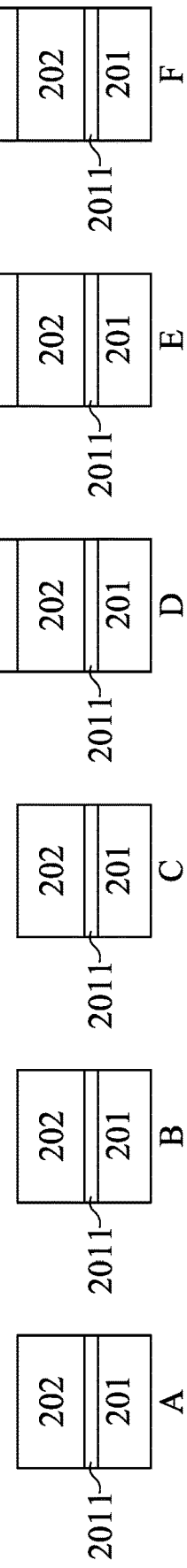
Figure 5H:
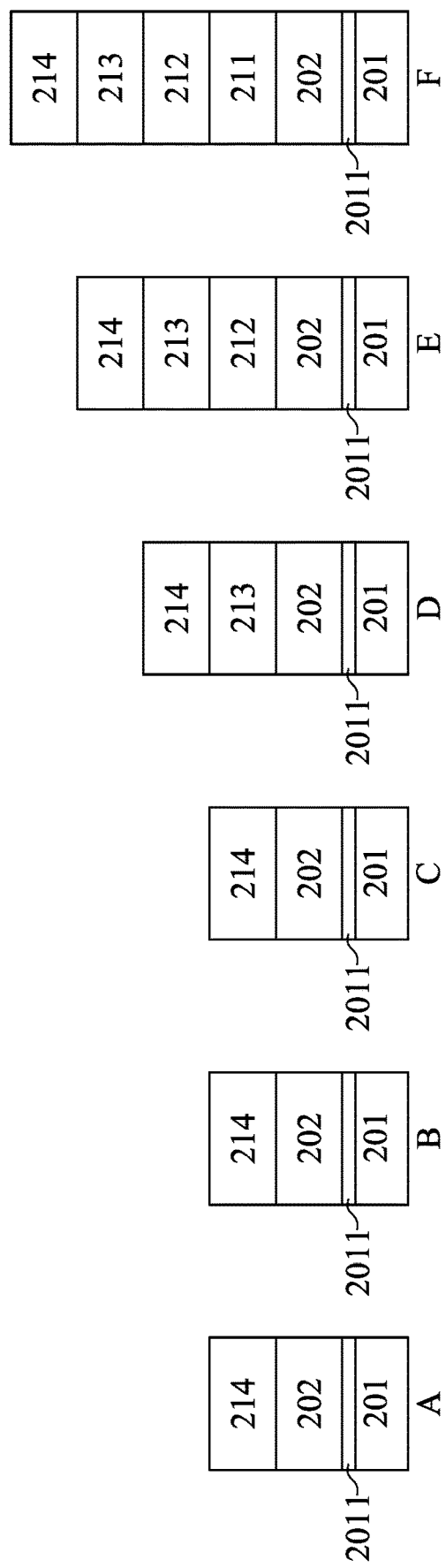
Figure 5I:
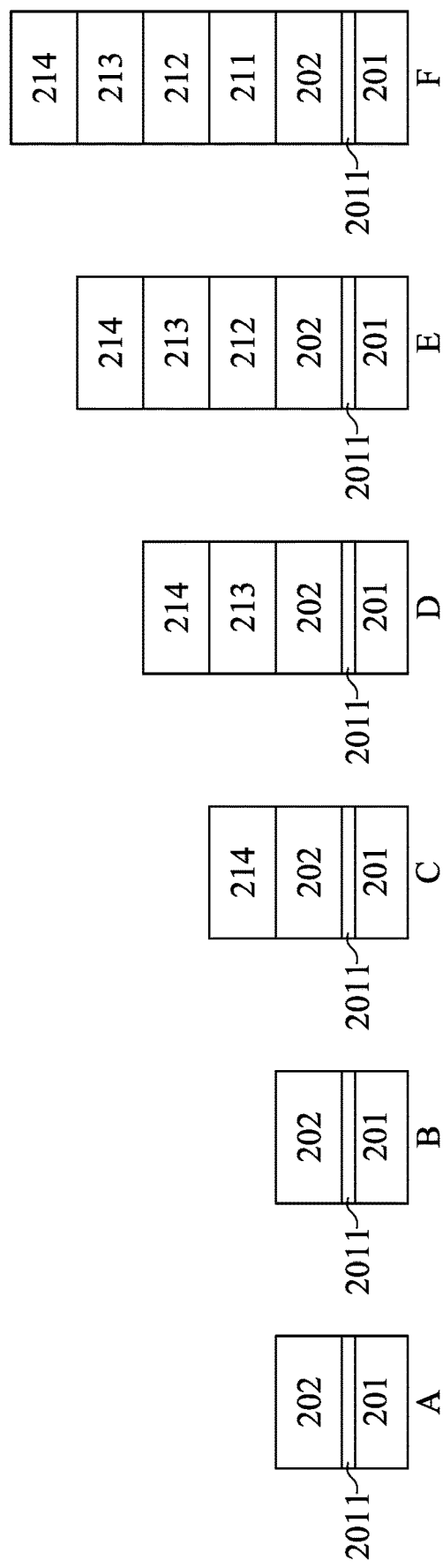
Figure 5J:
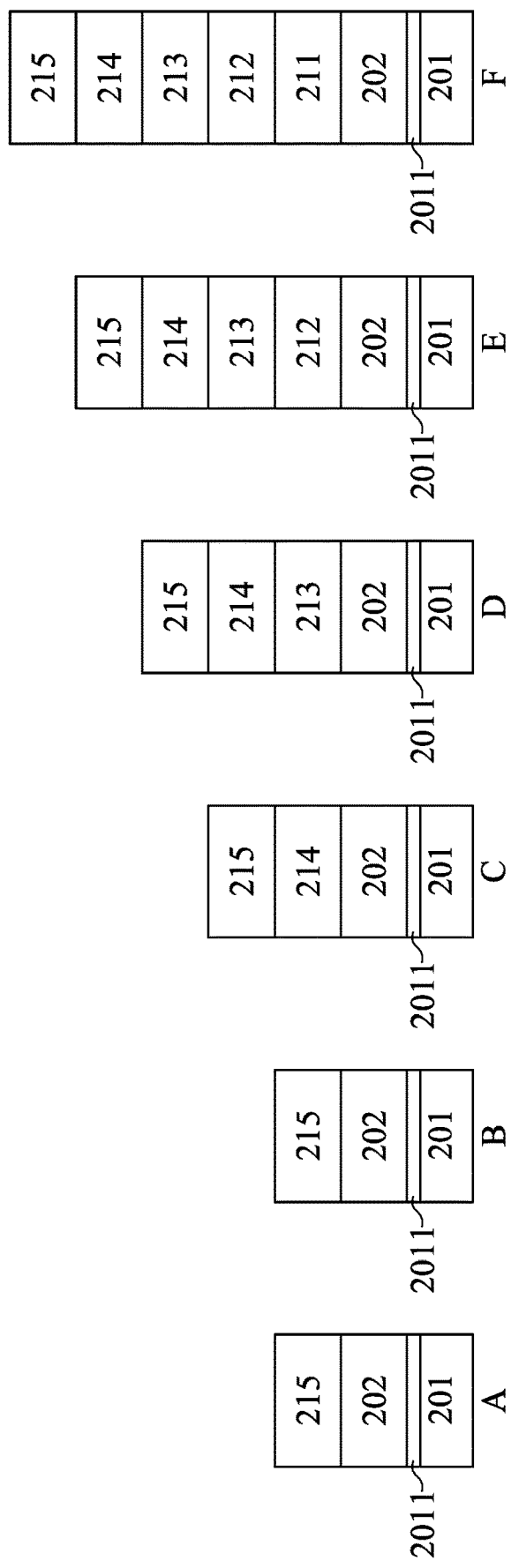
Figure 5K:
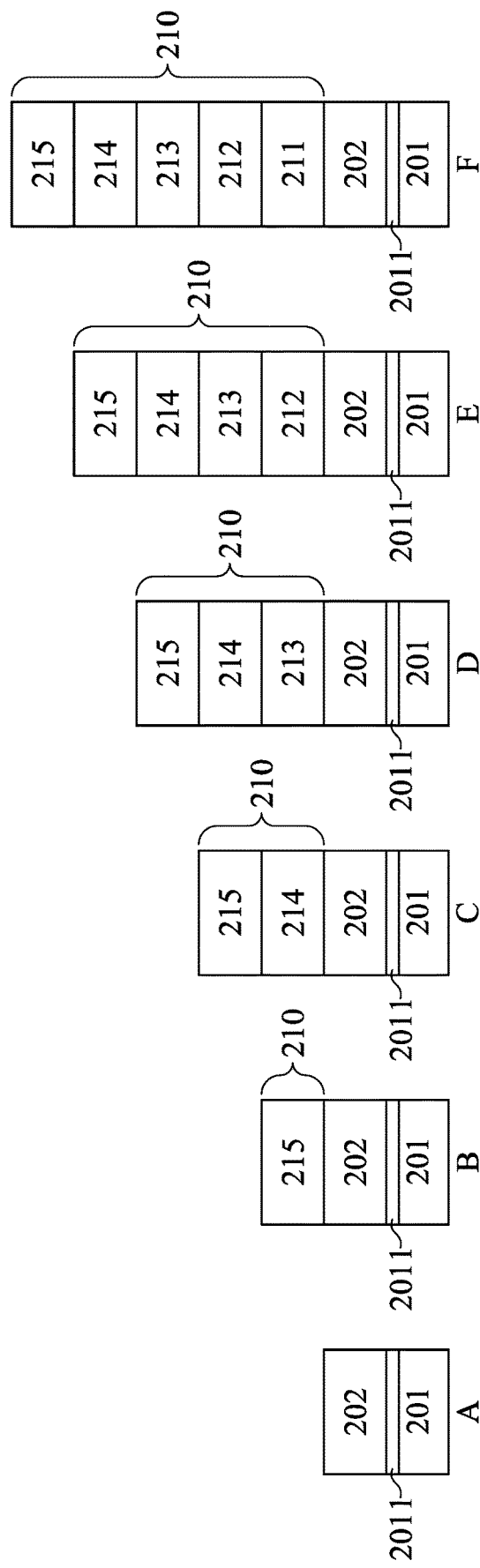

In some embodiments of the present disclosure, semiconductor devices of several types, such as N-type, N-low, N-ultralow, P-type, P-low, and P-ultralow, are formed on a semiconductor substrate. Work function layers are successively deposited on the semiconductor substrate, patterned, and partially removed, such that a desired number of work function layers are formed over the high-k dielectric layer at appropriate regions, according to the type of semiconductor device at the corresponding region. FIG. 5A-5K shows work function layers and a protective layer being formed over the high-k dielectric layer at different regions A-F of a semiconductor substrate. In some embodiments of the present disclosure, the regions of the N-type and P-type semiconductor devices are adjacent to each other. Deposited metal gate work function layers in adjacent regions may be in contact with each other in a sideways direction. Referring to FIG. 5A, a high-k dielectric layer 201, such as the high-k dielectric layer 113 of FIG. 2N, is deposited over the regions A-F of the semiconductor substrate, a high-k cap layer 201l is deposited over the high-k dielectric layer 201, and a barrier layer 202 is deposited over the high-k cap layer 201l. Next, referring to FIG. 5B, a first work function layer 211, such as the work function layer 114 of FIG. 2N, is deposited over the high-k dielectric layer 201. Referring to FIG. 5C, the first work function layer 211 is patterned and removed from regions corresponding to certain semiconductor devices, such that portions of the first work function layer 211 on the regions A-E are removed, and a portion of the first work function layer 211 remains on the region F of the semiconductor substrate. Referring to FIG. 5D, a second work function layer 212 is deposited over the remaining portion of the first work function layer 211 on the region F, and deposited over the high-k dielectric layer 201 on the regions A-E. Thereafter, referring to FIG. 5E, the second work function layer 212 is patterned and removed from regions corresponding to certain semiconductor devices, such that portions of the second work function layer 212 on the regions A-D are removed, and portions of the second work function layer 212 remain on the regions E and F. Referring to FIG. 5F, a third work function layer 213 is deposited over the remaining portions of the second work function layer 212 on the regions E and F, and deposited over the barrier layer 202 in the regions A-D. Referring to FIG. 5G, the third work function layer 213 is patterned and removed from regions corresponding to certain semiconductor devices, such that portions of the third work function layer 213 on the regions A-C are removed, and portions of the third work function layer 213 remain on the regions D-F. Referring to FIG. 5H, a fourth work function layer 214 is deposited over the third work function layer 213 on the regions D-F, and deposited over the barrier layer 202 on the regions A-C. Next, referring to FIG. 5I, the fourth work function layer 214 is patterned and removed from regions corresponding to certain semiconductor devices, such that portions of the fourth work function layer 214 on the regions A and B are removed, and portions of the fourth work function layer 214 remain on the regions C-F. Referring to FIG. 5J, a fifth work function layer 215 is deposited over the fourth work function layer 214 on the regions C-F, and deposited over the barrier layer 202 on the regions A-B. Referring to FIG. 5K, the fifth work function layer 215 is patterned and removed from regions corresponding to certain semiconductor devices, such that a portion of the fifth work function layer 215 on the region A is removed, and portions of the fifth work function layer 215 remain on the regions B-F. In some embodiments, an optional controlled oxidation of the barrier layer 202 is done at any stage before depositing the first, second, third, fourth or fifth work function layer 211, 212, 213, 214, 215, or after patterning the fifth work function layer 215.

Thereby, work function stacks 210 including at least one of the work function layers 211-215 are formed on the regions B-F of the semiconductor substrate. The work function stacks 210 having different numbers of the work function layers 211-215 have different heights. The work function layers 211-215 are similar to the work function layer 114 of FIG. 2N. In addition, no work function stack 210 remains on the region A. Specifically, the regions A, B, C, D, E, and F correspond respectively to semiconductor devices of type N-ultralow, N-low, N-basic, P-basic, P-low, and P-ultralow.

Figure 5L:
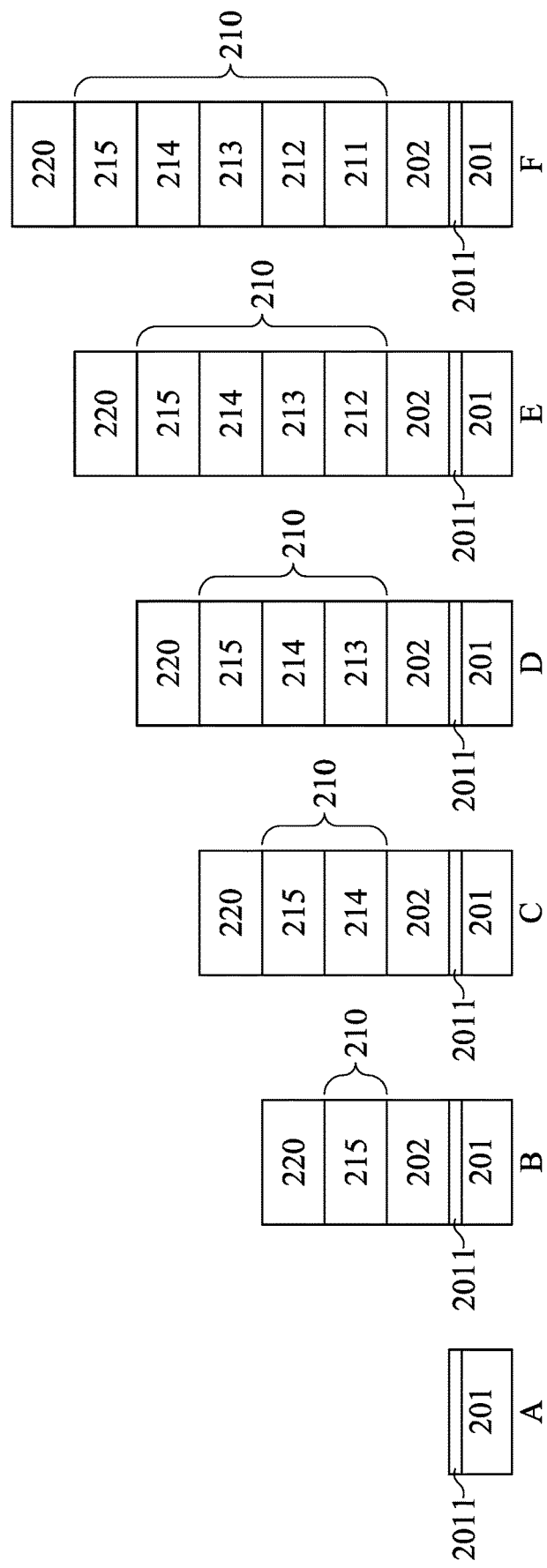

Referring to FIG. 5L, a precursor, such as the precursor 115A of FIG. 2M, is deposited over the fifth work function layer 215, and reacts with the fifth work function layer 215 to form a protective layer 220, such as the protective layer 116 of FIG. 2N. In some embodiments, the precursor is also deposited over the barrier layer 202. Specifically, in some embodiments, the barrier layer 202 includes tantalum oxynitride and/or tantalum nitride, and the precursor includes one or more of fluoride compounds such as tungsten fluoride, tantalum fluoride, titanium fluoride, or chloride compounds such as tungsten chloride (WCl$_5$), tantalum chloride (TaCl$_5$), and titanium chloride (TiCl$_4$), and/or H$_2$, B$_2$H$_6$, SiH$_4$, BCl$_3$, O$_2$, NH$_3$, Ar plasma or the like, and is deposited in contact with the barrier layer 202. The precursor reacts with the barrier layer 202 exposed on the region A of the semiconductor substrate, and dissolves/etches off the barrier layer 202 thereat.

Figure 5M:
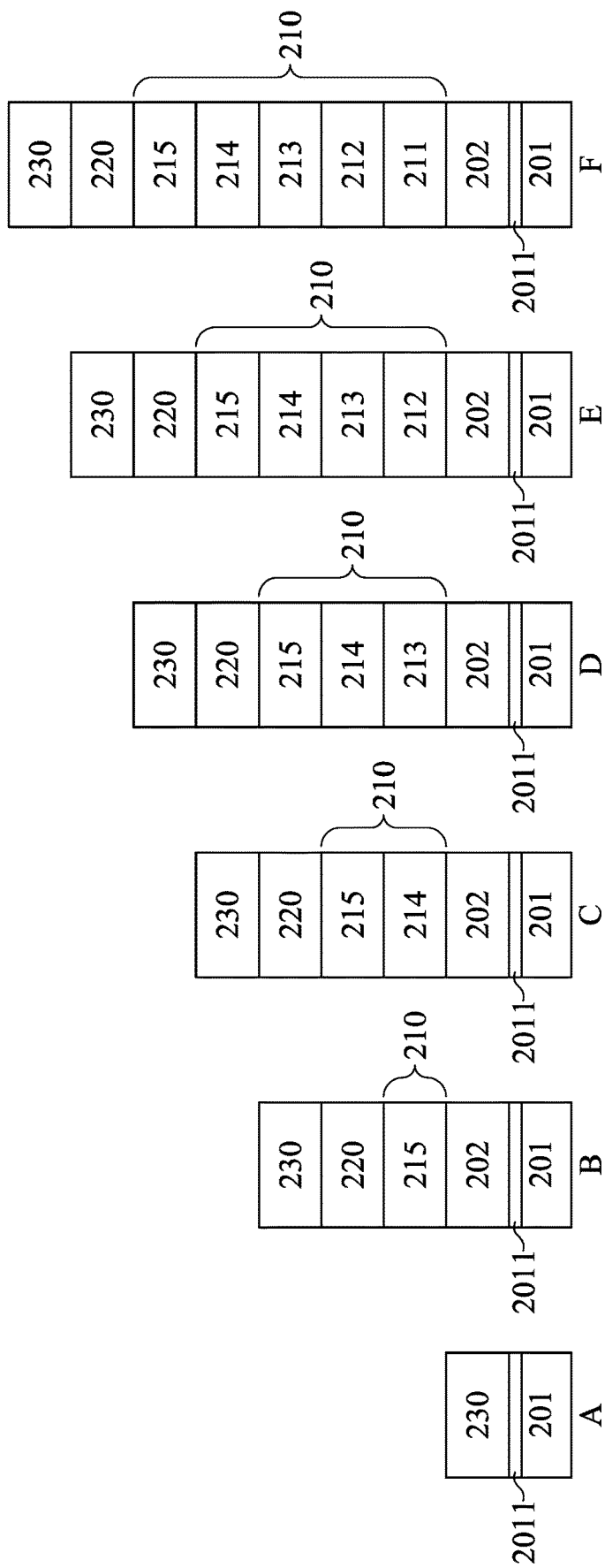

Referring to FIG. 5M, metal gate electrodes 230 are deposited over the protective layer 220 on the regions B-F, and over the barrier layer 202 on the region A. In each of the regions B-F, the protective layer 220 acts as a barrier between the metal gate electrode 230 and the work function stack 210, and prevents diffusion of atoms there-between. In some embodiments of the present disclosure, the precursor reacts with the work function stack 210 to form a protective layer 220 covering the top face of the work function stack 210 and also a side face of the work function stack 210. For example, the protective layer 116 of FIG. 2N is formed over the top and side faces of the work function layer 114 of FIG. 2N. Thereby, when the work function stack 210 in one region is adjacent to and contacts the work function stack 210 of a semiconductor device in a neighboring region, the protective layer 220 prevents the diffusion of atoms across nearby semiconductor devices and protects the work function stack 210 from the metal gate electrode 230 of the neighboring semiconductor device as well.

Figure 5N:
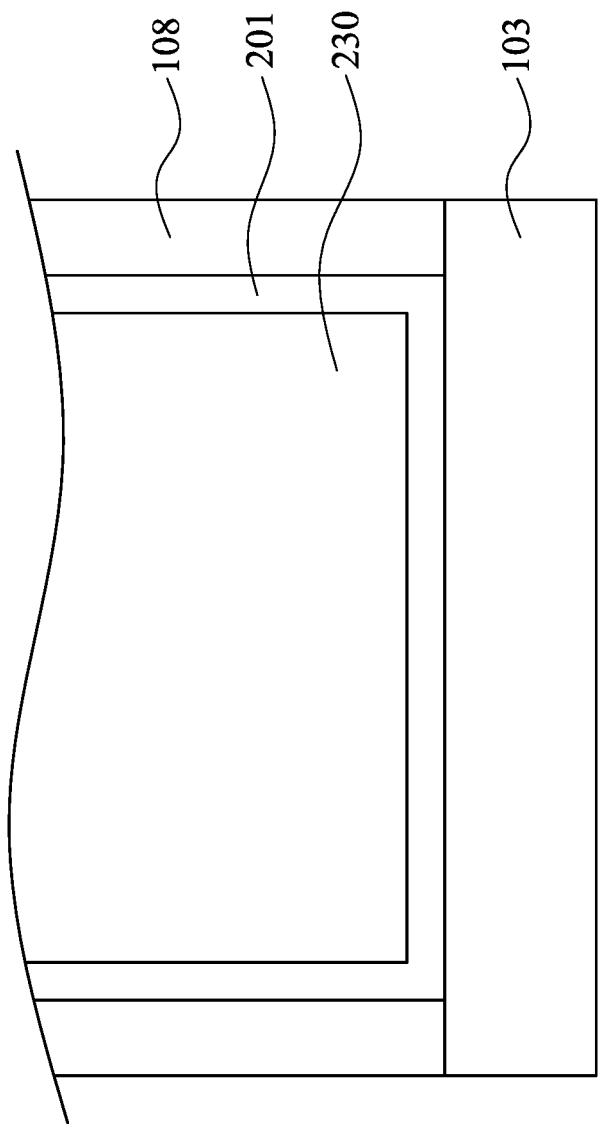
FIG. 5N shows a cross-sectional view of a semiconductor device at region A of FIG. 5M.

In region A, the barrier layer 202 is removed, and the metal gate electrode 230 contacts the high-k dielectric layer 201. Therefore, the metal gate electrode 230 at region A is proximal to the fin structure 103 throughout the channel length between the spacers 108, as shown in FIG. 5N which illustrates a cross-sectional view of the high-k dielectric layer 201 and the metal gate electrode 230 on the region A of the substrate. A desired work function of an N-ultralow device is thus achieved for the semiconductor device at region A. Furthermore since the metal gate electrode 230 is close to the channel at the corners of the fin structure 103 and the sidewall spacers 108, this ensures uniform effective work function across the fin length and better turn-on performance, especially at the corners of the fin structure 103.

Figure 6:
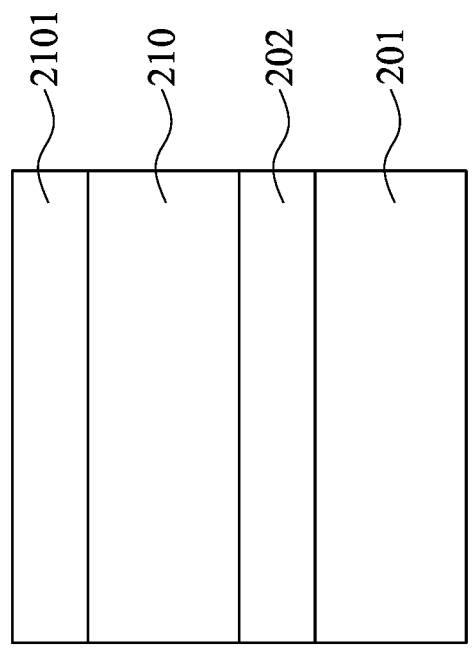
FIG. 6 shows layers on one region of the semiconductor substrate in FIG. 5K.

FIG. 6 shows layers on one of the regions B-F of the semiconductor substrate in FIG. 5K. In some embodiments of the present disclosure, the work function stack 210 includes titanium nitride, and a top portion of the work functions tack 210 exposed to oxygen is oxidized to form a titanium oxide portion 2101. The titanium oxide portion 2101 increases the resistivity of the work function stack 210, resulting in poor performance of the device due to increased gate resistance (Rg).

Figure 7:
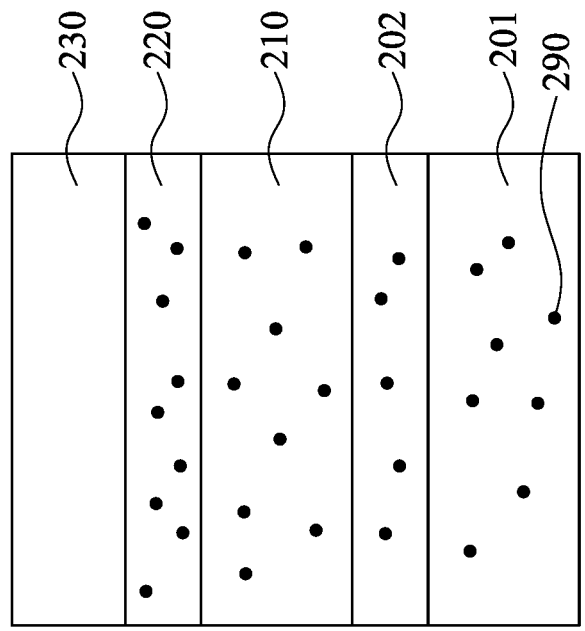
FIG. 7 shows layers on one region of the semiconductor substrate in FIG. 5M.

FIG. 7 shows layers on one of the regions B-F of the semiconductor substrate in FIG. 5M. In some embodiments of the present disclosure, as shown in FIGS. 6 and 7, the precursor reacts with the titanium oxide portion 2101 of the work function stack 210 to dissolve the titanium oxide portion 2101 and form reaction products. In some embodiments, the precursor includes fluoride compounds such as tungsten fluoride, tantalum fluoride, titanium fluoride, or the like, and is deposited in contact with the titanium oxide portion 2101. After reaction, the titanium oxide portion 2101 of the work function stack 210 is dissolved, and the protective layer 220 made of tungsten, tantalum, titanium, or the like compound, is formed over and in contact with the work function stack 210 by further reaction of the precursor with the bulk work function layer 210. By replacing the titanium oxide portion 2101 with the protective layer 220, the work function of the work function stack 210 is improved. Additionally, the protective layer 220 can protect the work function stack 210 from further exposure to air and further oxidation. In some embodiments of the present disclosure, the precursor reacts with the work function stack 210 to form a protective layer covering the top face of the work function stack 210 and also a side face of the work function stack 210. For example, the protective layer 116 of FIG. 2N is formed over the top and side faces of the work function layer 114 of FIG. 2N. Thereby, the work function stack 210 is protected from exposure to air on all sides, and thus protected from being oxidized. Furthermore, when the work function stack 210 is adjacent to and contacts the work function stack 210 of a gate of a neighboring semiconductor device, the protective layer acts as a barrier preventing atom diffusion across nearby devices. Moreover, the metal gate electrode 230 is then formed on the protective layer 220. In some embodiments of the present disclosure, the metal gate electrode 230 is made of titanium aluminum.

Figure 8:
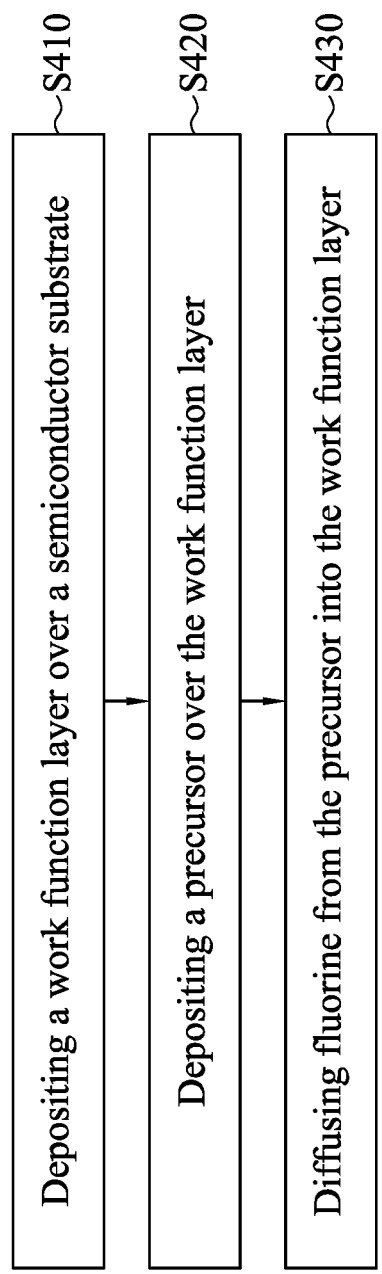
FIG. 8 shows a flowchart of a method for forming a semiconductor device according to some embodiments of the present disclosure.

FIG. 8 shows a flowchart of a method for forming a semiconductor device according to some embodiments of the present disclosure. In step S410, a work function layer is deposited over a semiconductor substrate. In step S420, a precursor is deposited over the work function layer. In step S430, fluorine from the precursor is diffused into the work function layer.

Referring again to FIG. 7, in some embodiments, fluorine 290 from the precursor is diffused into the work function layers of the work function stack 210, and is further diffused into the barrier layer 202 and the high-k dielectric layer 201, and passivates oxygen vacancies in the high-k dielectric layer 201. The fluorine 290 below the metal gate electrode layer 230 blocks the aluminum of the metal gate electrode 230 from diffusing into the work function stack 210 and the high-k dielectric layer 201, thereby preserving a high work function of the work function stack 210 and improving the reliability of the high-k dielectric layer 201. Furthermore, the fluorine 290 diffused into the work function stack 210, the barrier layer 202, and the high-k dielectric layer 201 purifies these layers by removing impurities such as chloride remaining from previous processes.

Figure 9A:
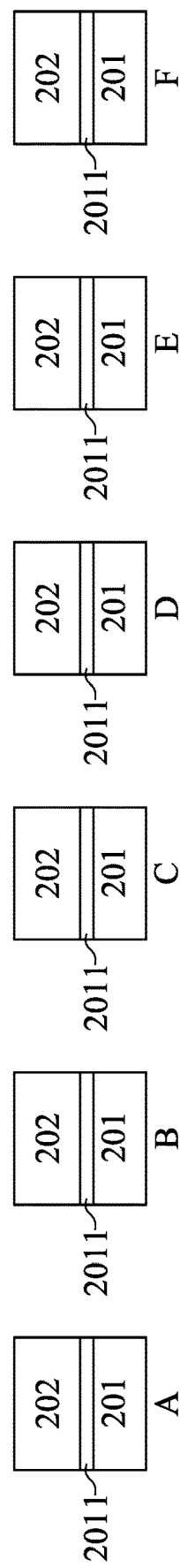
FIGS. 9A-9Q show schematic diagrams at various stages of a method for forming semiconductor devices according to some embodiments of the present disclosure.
Figure 9B:
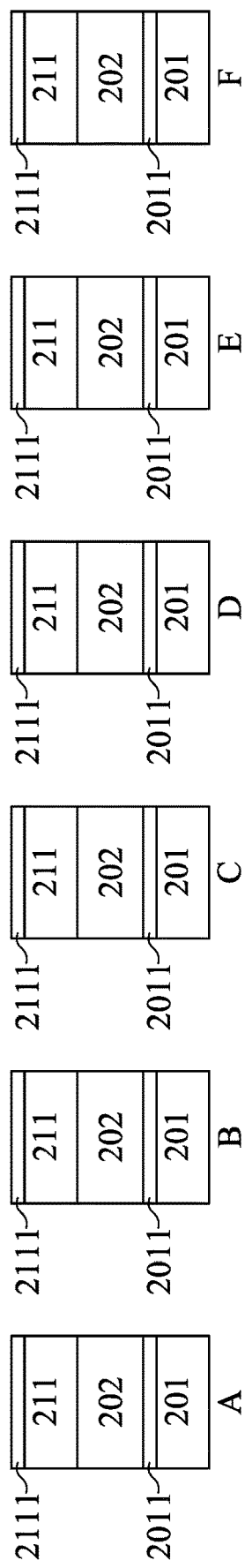
Figure 9C:
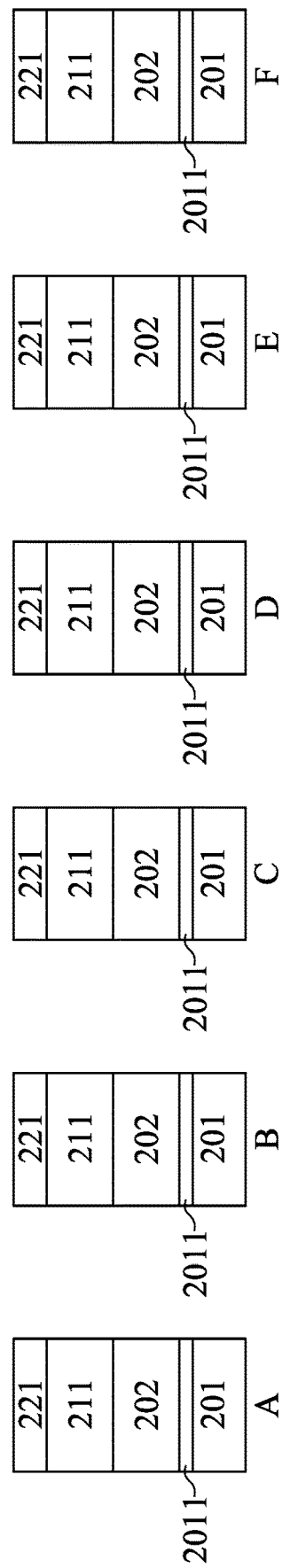
Figure 9D:
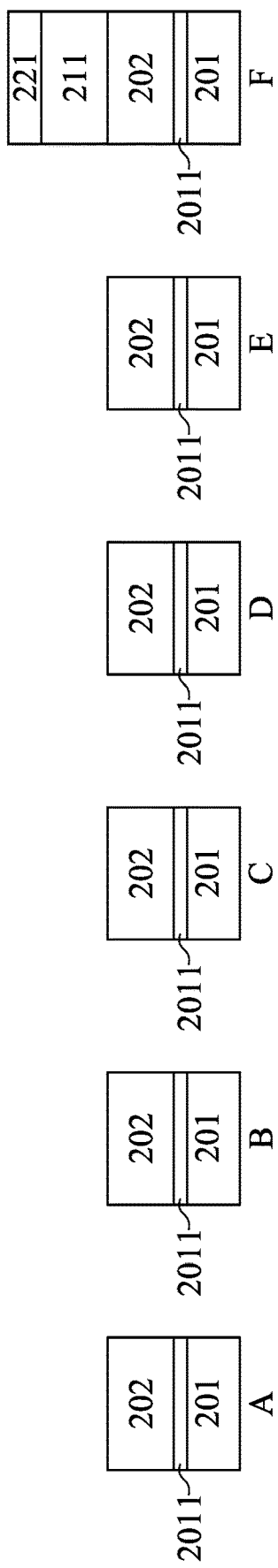
Figure 9E:
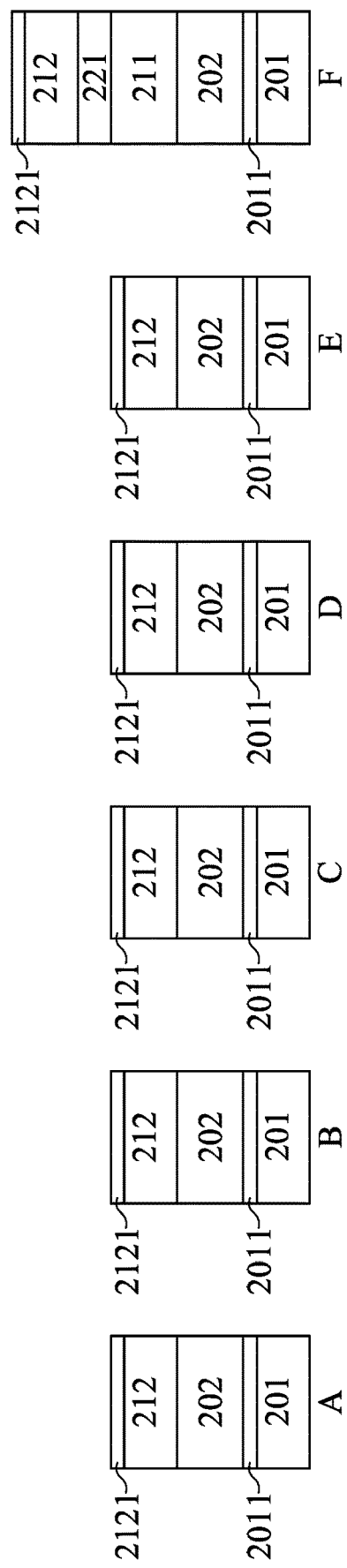
Figure 9F:
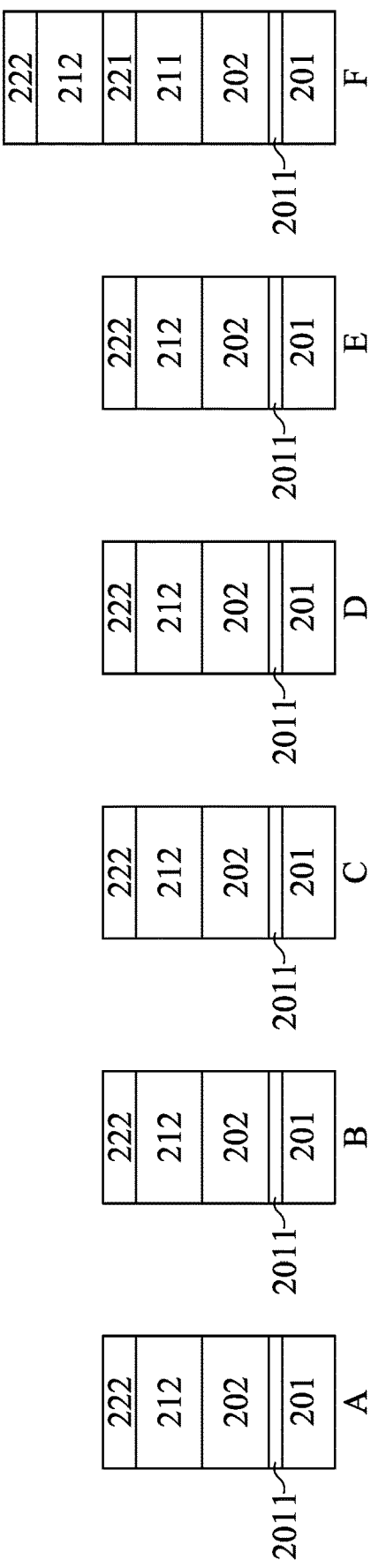
Figure 9G:
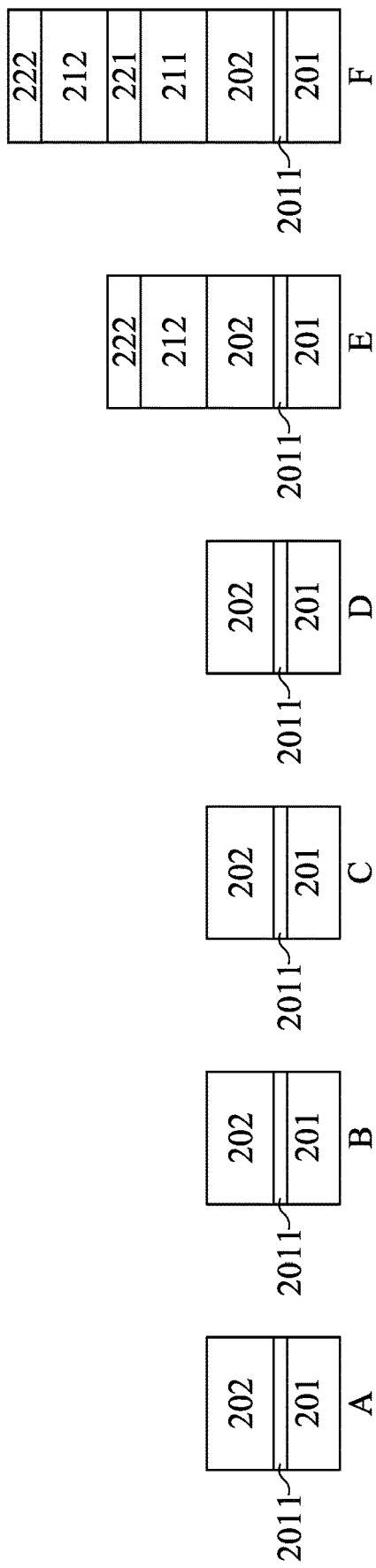
Figure 9H:
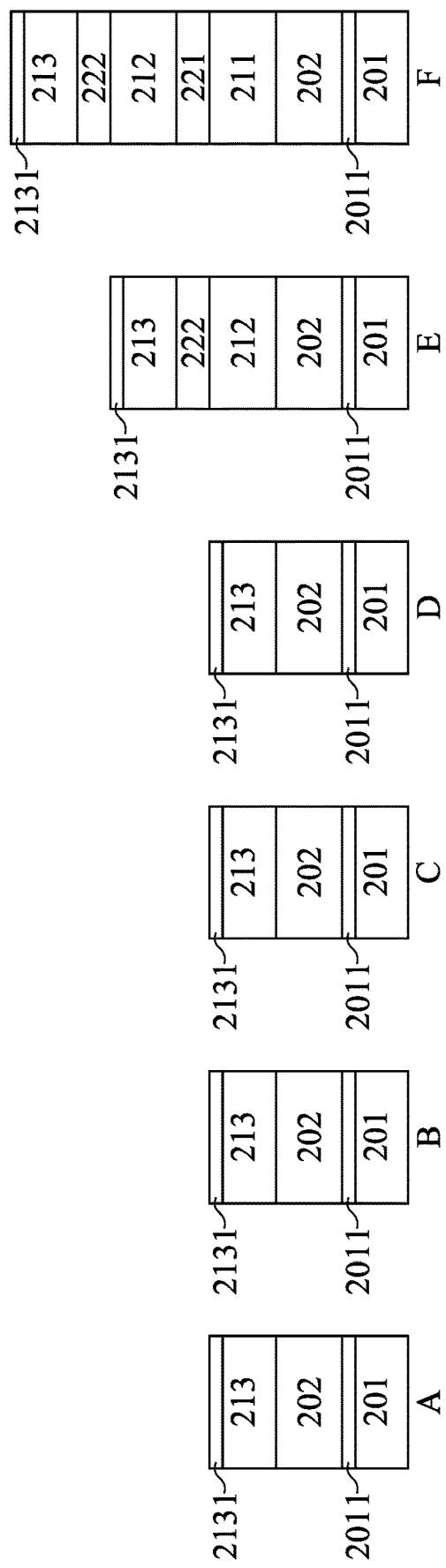
Figure 9I:
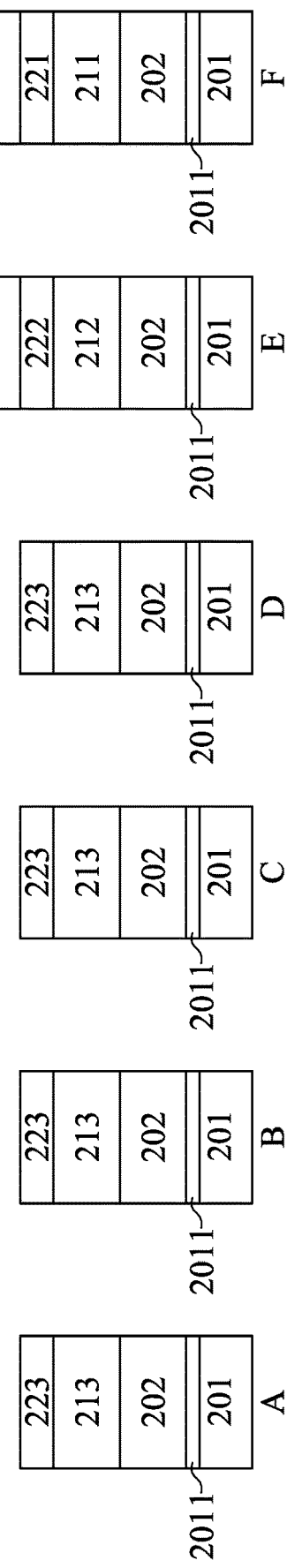
Figure 9J:
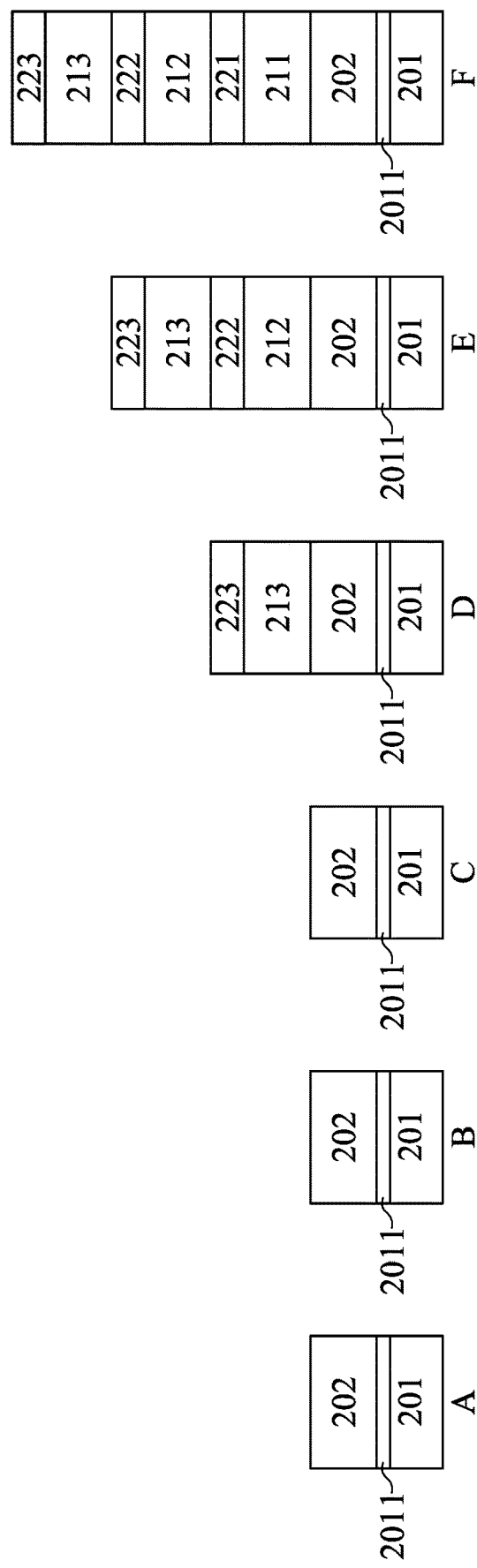
Figure 9K:
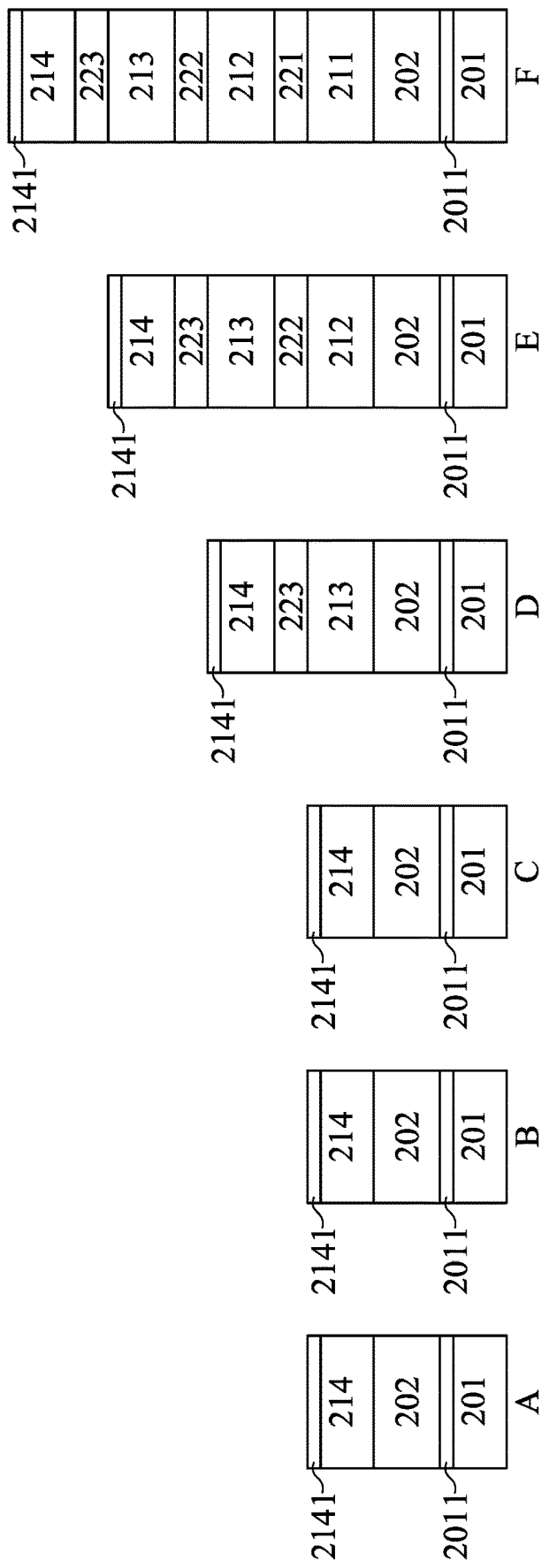
Figure 9L:
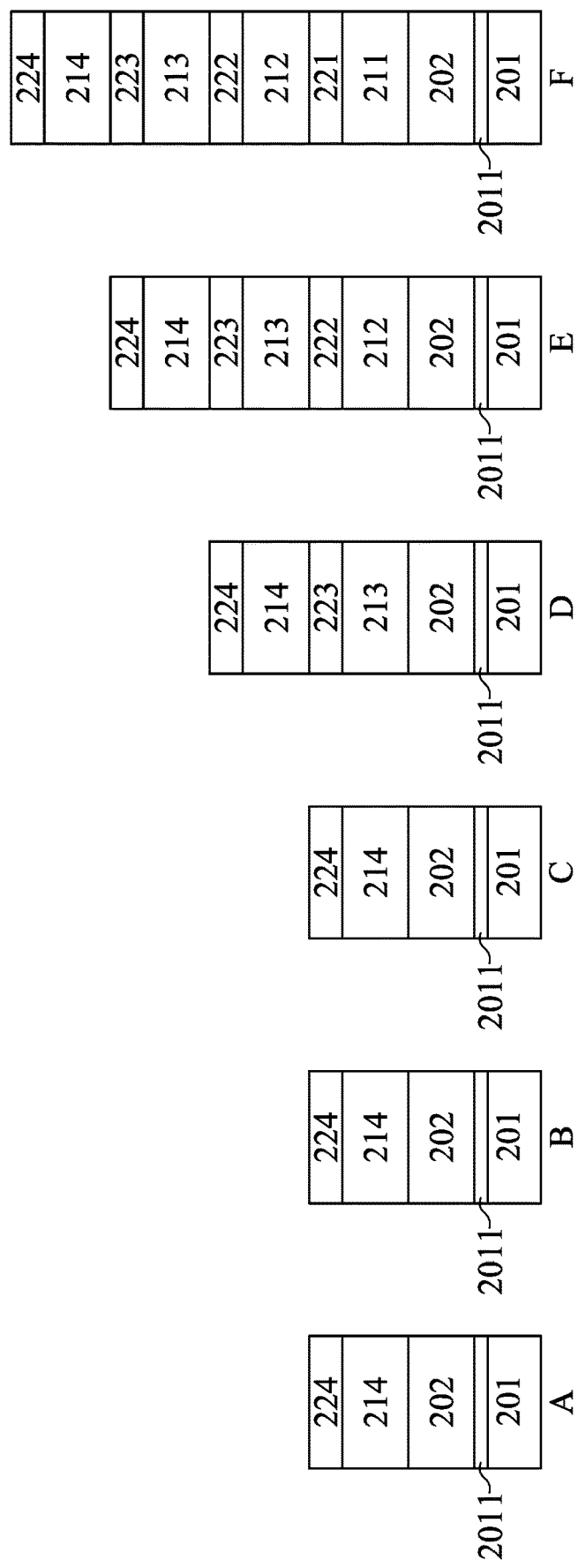
Figure 9M:
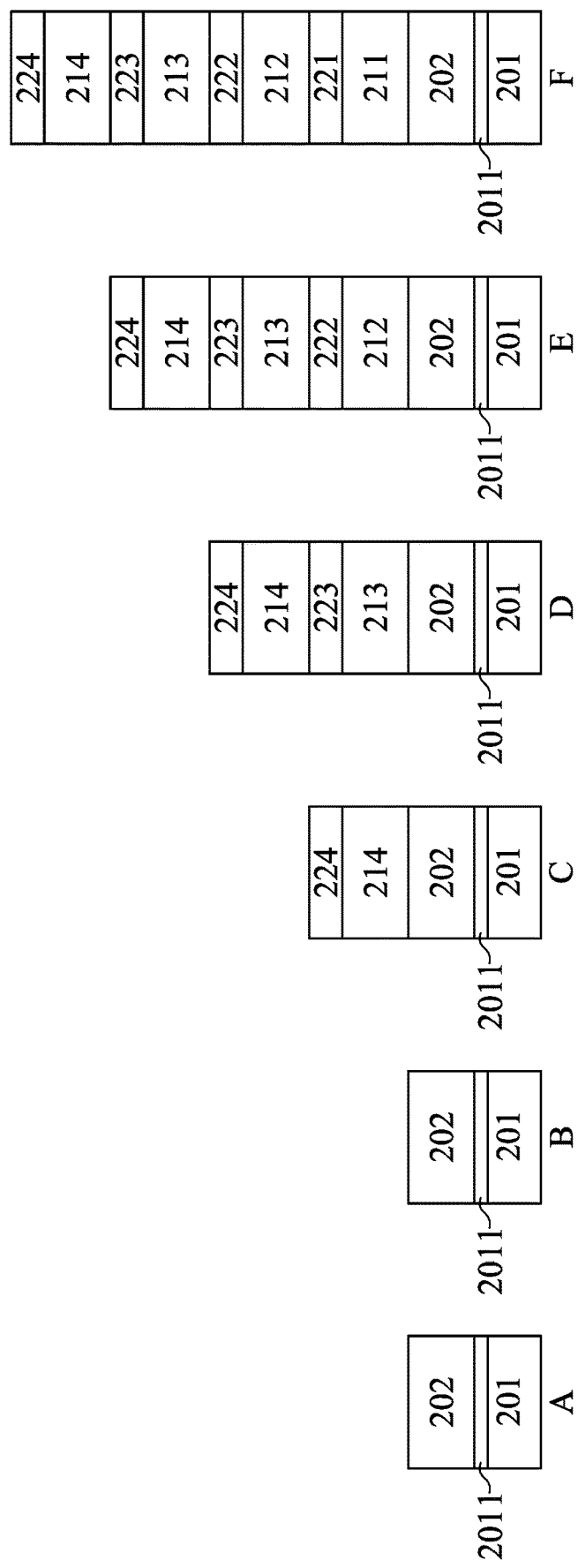
Figure 9N:
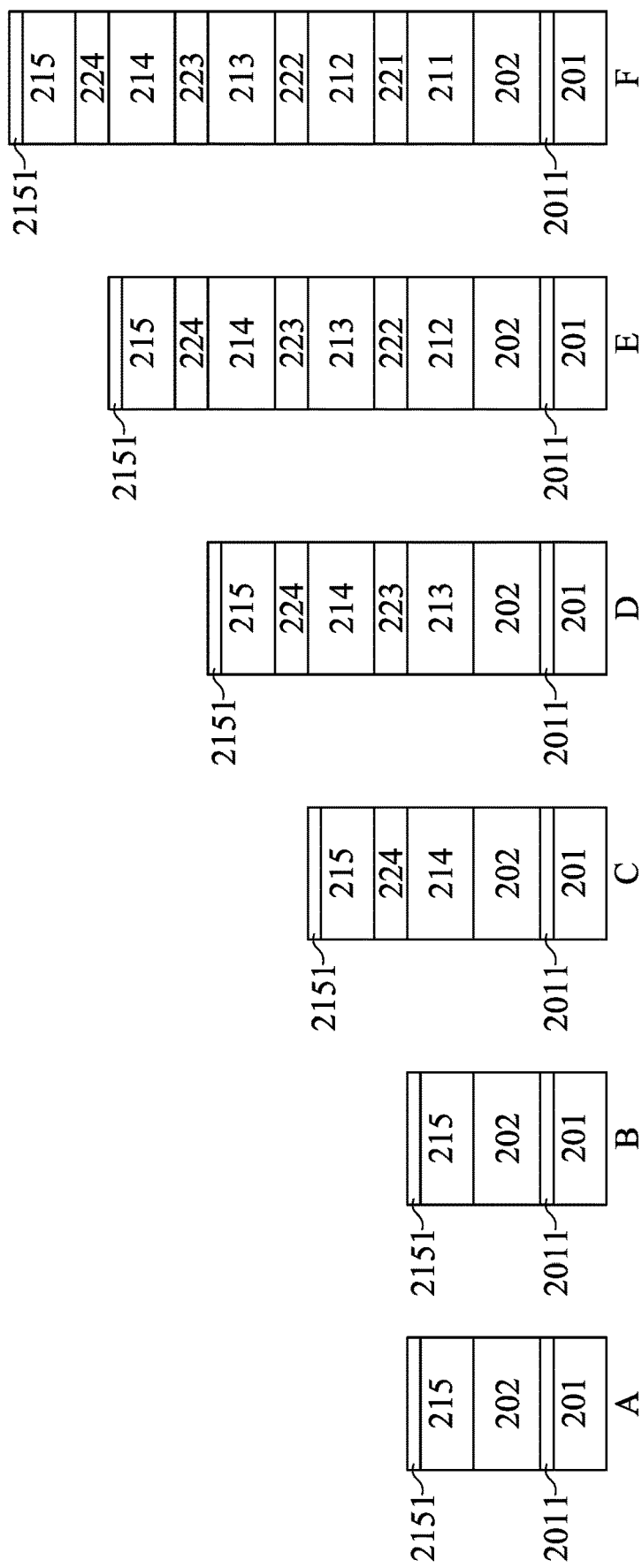
Figure 9O:
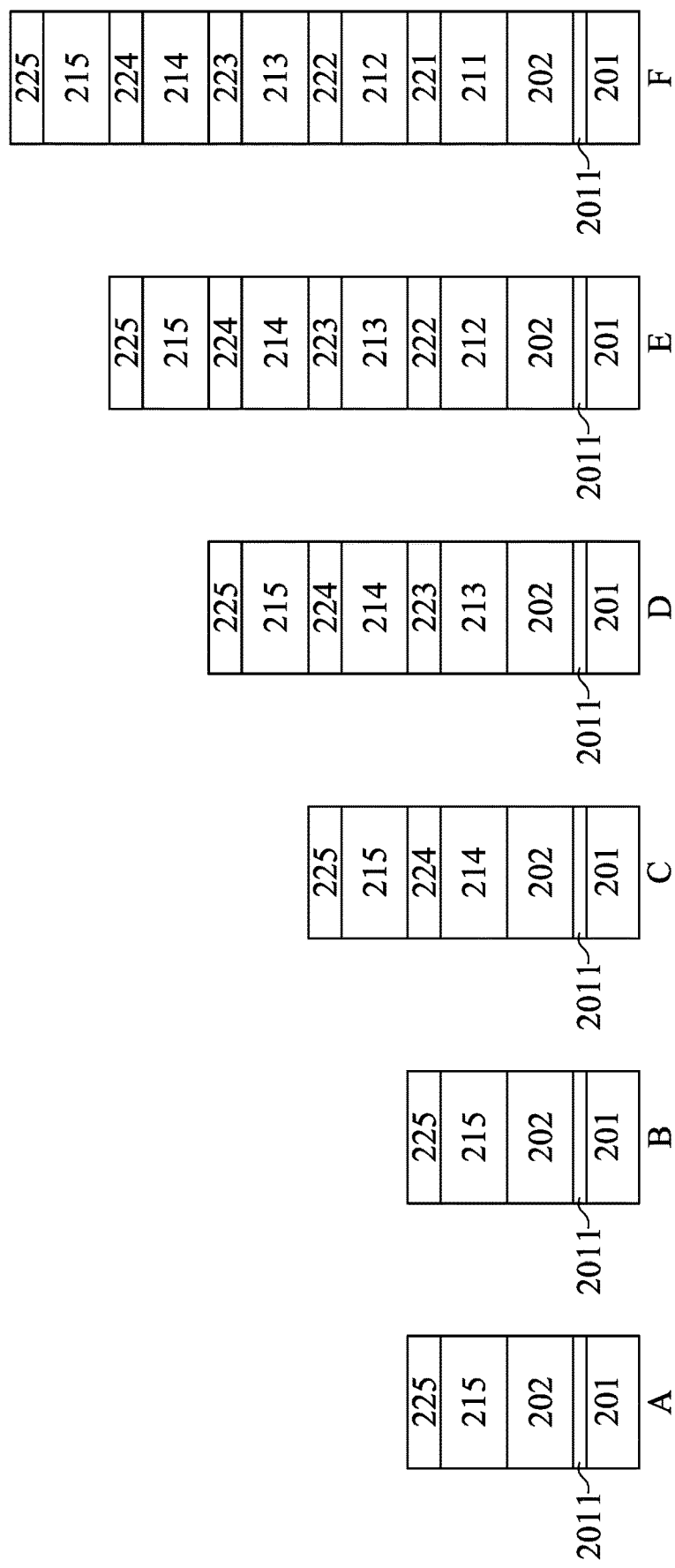
Figure 9P:
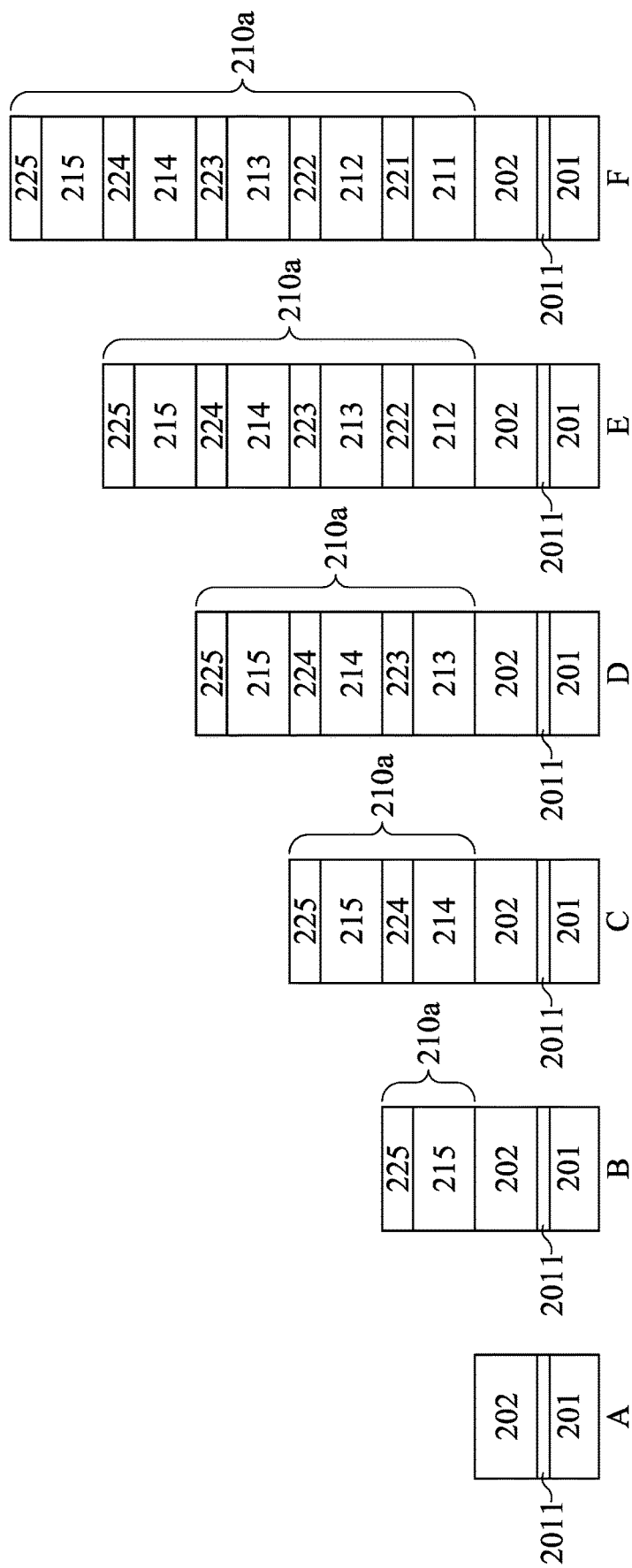
Figure 9Q:
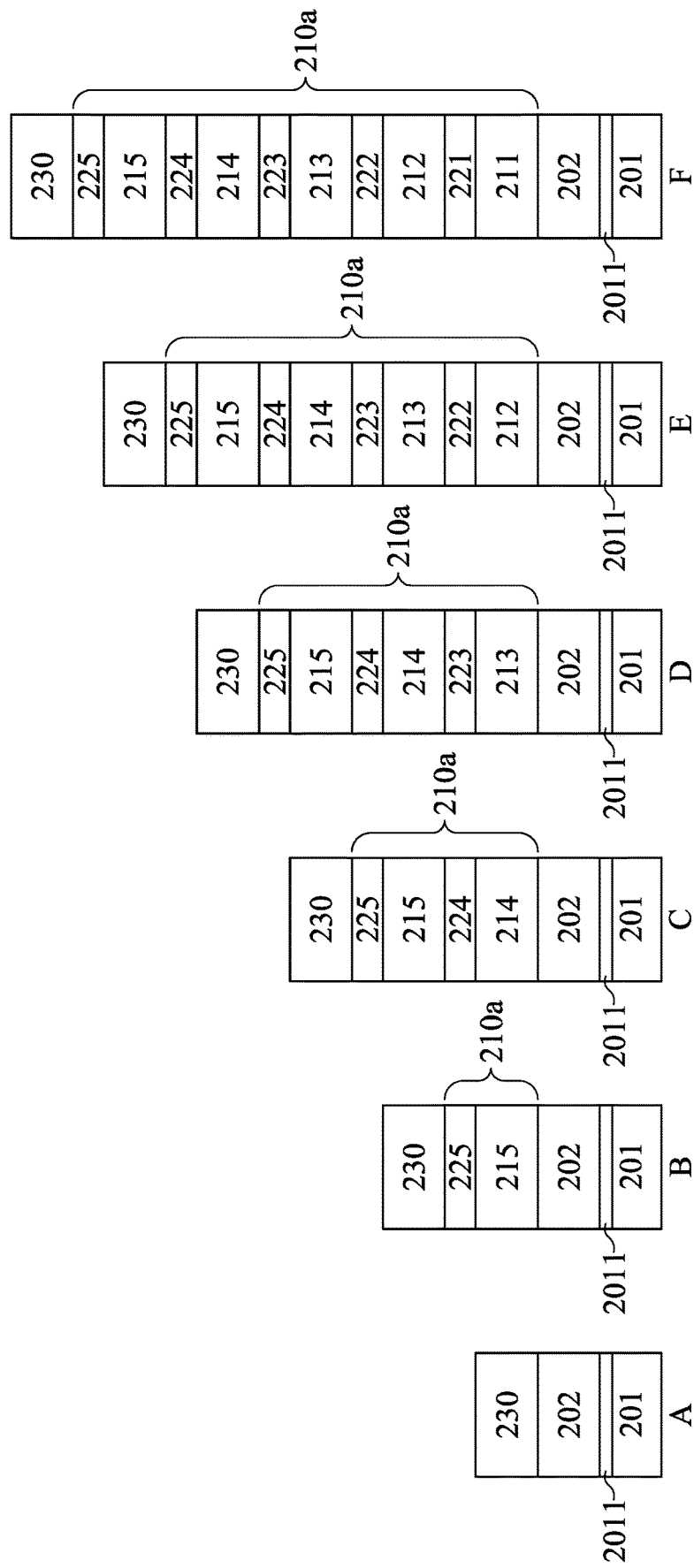

In some embodiments of the present disclosure, a precursor is deposited over each work function layer after the work function layer is deposited. FIG. 9A-9Q show work function layers and precursor being alternately formed over the high-k dielectric layer at different regions A-F of the semiconductor substrate. Referring to FIG. 9A, a high-k dielectric layer 201 is deposited over a semiconductor substrate, and a barrier layer 202 is deposited over the high-k dielectric layer 201. Referring to FIG. 9B, a first work function layer 211 is deposited over the high-k dielectric layer 201. Referring to FIG. 9C, a first precursor is deposited over and reacts with the first work function layer 211, thereby selectively removing the top oxidized part of work function layer 2111 and thereafter forming a first protective layer 221. Referring to FIG. 9D, the first work function layer 211 and the first protective layer 221 are patterned and removed from regions corresponding to certain semiconductor devices, such that portions of the first work function layer 211 and the first protective layer 221 on the regions A-E are removed, and a portion of the first work function layer 211 and a portion of the first protective layer 221 remain on the region F of the semiconductor substrate. Referring to FIG. 9E, a second work function layer 212 is deposited over the first protective layer 221 in region F, and deposited over the barrier layer 202 in regions A-E. Referring to FIG. 9F, a second precursor is deposited over and reacts with the second work function layer 212, thereby selectively removing the top oxidized part of work function layer 2121 and thereafter forming a second protective layer 222. Referring to FIG. 9G, the second work function layer 212 and the second protective layer 222 are patterned and removed from regions corresponding to certain semiconductor devices, such that portions of the second work function layer 212 and the second protective layer 222 on the regions A-D are removed, and portions of the second work function layer 212 and the second protective layer 222 remain on the regions E and F of the semiconductor substrate. Referring to FIG. 9H, a third work function layer 213 is deposited over the second protective layer 222 in regions E and F, and deposited over the barrier layer 202 in regions A-D. Referring to FIG. 9I, a third precursor is deposited over and reacts with the third work function layer 213, thereby selectively removing the top oxidized part of the work function layer 2111 and thereafter forming a third protective layer 223. Referring to FIG. 9J, the third work function layer 213 and the third protective layer 223 are patterned and removed from regions corresponding to certain semiconductor devices, such that portions of the third work function layer 213 and the third protective layer 223 on the regions A-C are removed, and portions of the third work function layer 213 and the third protective layer 223 remain on the regions D-F of the semiconductor substrate. Referring to FIG. 9K, a fourth work function layer 214 is deposited over the third protective layer 223 in regions D-F, and deposited over the barrier layer 202 in regions A-C. Referring to FIG. 9L, a fourth precursor is deposited over and reacts with the fourth work function layer 214, thereby selectively removing the top oxidized part of the work function layer 2111 and thereafter forming a fourth protective layer 224. Referring to FIG. 9M, the fourth work function layer 214 and the fourth protective layer 224 are patterned and removed from regions corresponding to certain semiconductor devices, such that portions of the fourth work function layer 214 and the fourth protective layer 224 on the regions A and B are removed, and portions of the fourth work function layer 214 and the fourth protective layer 224 remain on the regions C-F of the semiconductor substrate. Referring to FIG. 9N, a fifth work function layer 215 is deposited over the fourth protective layer 224 in regions C-F, and deposited over the barrier layer 202 in regions A and B. Referring to FIG. 9O, a fifth precursor is deposited over and reacts with the fifth work function layer 215, thereby selectively removing the top oxidized part of the work function layer 2111 and thereafter forming a fifth protective layer 225. Referring to FIG. 9P, the fifth work function layer 215 and the fifth protective layer 225 are patterned and removed from regions corresponding to certain semiconductor devices, such that portions of the fifth work function layer 215 and the fifth protective layer 225 on the region A are removed, and portions of the fifth work function layer 215 and the fifth protective layer 225 remain on the regions B-F of the semiconductor substrate.

Thereby, work function stacks 210a including at least one of the work function layers 211-215 and at least one of the protective layers 221-225 are formed on the regions B-F of the semiconductor substrate. The work function stacks 210a having different numbers of the work function layers 211-215 and different numbers of the protective layers 221-225 have different heights and/or composition.

Referring to FIG. 9Q, a metal gate electrode 230 is deposited over the fifth protective layer 225 and the barrier layer 202. The protective layers 221-225 acts as a barrier between the metal gate electrode 230 and the work function layers 211-215, and prevents diffusion of atoms from the metal gate electrode 230 to the work function layers 211-215.

In some embodiments of the present disclosure, each of the work function layers 211-215 includes titanium nitride or tungsten nitride or tungsten carbonitride and a top portion of each of the work function layers 211-215 exposed to oxygen is oxidized to form a titanium oxide portion. The titanium oxide portion increases the resistivity of the work function layer 211-215, resulting in poor gate resistance of the work function stack 210a including the work function layer 211-215 and the protective layers 221-225.

In some embodiments of the present disclosure, the precursor reacts with the top oxidized portion of each of the work function layers 211-215 to dissolve the oxide portion and form reaction products. In some embodiments, the precursor includes fluoride compounds such as tungsten fluoride, tantalum fluoride, titanium fluoride, or the like, and is deposited in contact with the titanium oxide portion. After reaction, the oxide portions of the work function layers 211-215 are dissolved, and the protective layers 221-225 made of tungsten, tantalum, titanium, or its compounds, are respectively formed over and in contact with the work function layers 211-215. By replacing the oxide portions with the protective layers 221-225, the work function of the work function stack 210a is improved. In some embodiments the composition of the protective layer 221-225 can be changed by soaking in another precursor such as ammonia or H2 to form nitrides or to remove Cl, F therefrom.

In some embodiments of the present disclosure, the metal gate electrode 230 is made of titanium aluminum. In some embodiments, the fluorine 290 (see FIG. 7) from the precursor is diffused into the work function layers 211-215 of the work function stack 210a, and is further diffused into the barrier layer 202 and the high-k dielectric layer 201, and fills oxygen vacancies in the high-k dielectric layer 201 and passivates the Si dangling bonds. The fluorine 290 diffused into the work function layers 211-215 and the oxygen vacancies of the high-k dielectric layer 201 blocks the aluminum of the metal gate electrode 230 from diffusing into the work function layers 211-215 and passivates the oxygen vacancies of the high-k dielectric layer 201, thereby preserving a high work function of the work function stack 210a.

Figure 10B:
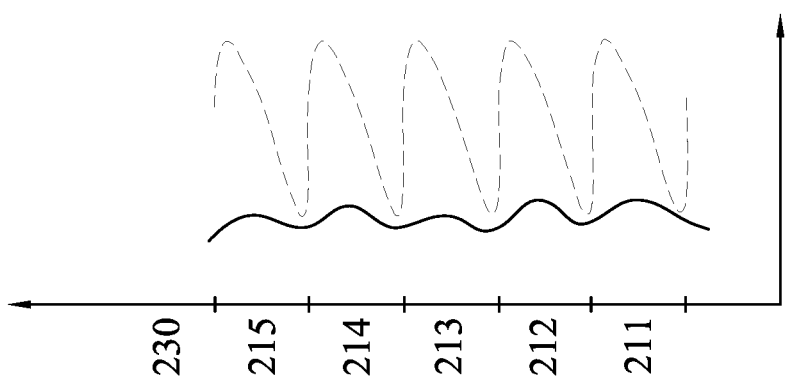
FIGS. 10A-10B respectively show graphs of concentrations of tungsten and oxygen or titanium oxide according to some embodiments of the present disclosure.
Figure 10A:
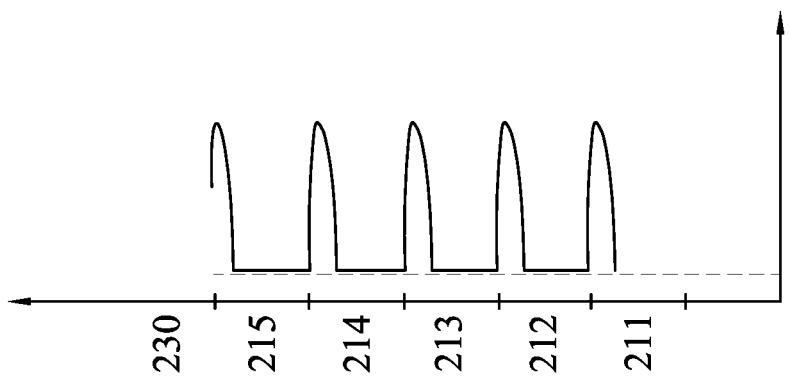

FIG. 10A shows a graph of concentrations of metal from a protective metal film (tungsten, tantalum or titanium etc.) at different heights of the work function stack formed by some embodiments of the present disclosure (shown by the solid line), and concentrations of the same at different heights of the work function stack formed by traditional methods (shown by the dotted line). In the work function stack formed by traditional methods, tungsten is absent throughout the work function layers 211-215. In the work function stack formed by embodiments of the present disclosure, concentrations of tungsten are high at top portions of each of the work function layers 211-215, due to depositions of the precursor thereat during the process of forming the work function stack.

FIG. 10B shows a graph of concentrations of oxygen or titanium oxide at different heights of the work function stack formed by some embodiments of the present disclosure (shown by the solid line), and concentrations of the same at different heights of the work function stack formed by traditional methods (shown by the dotted line). In the work function stack formed by traditional methods, concentrations of oxygen or titanium oxide are high at top portions of each of the work function layers 211-215, due to exposure to air and oxidation after depositions of said work function layers 211-215. In the work function stack formed by some embodiments of the present disclosure, concentrations of oxygen, titanium oxide are reduced due to selective etching and removal of the top oxidized part of the work function layers 2111-2151 due to reactions between the oxygen or titanium oxide or titanium oxynitride and the precursor.

Figure 11B:
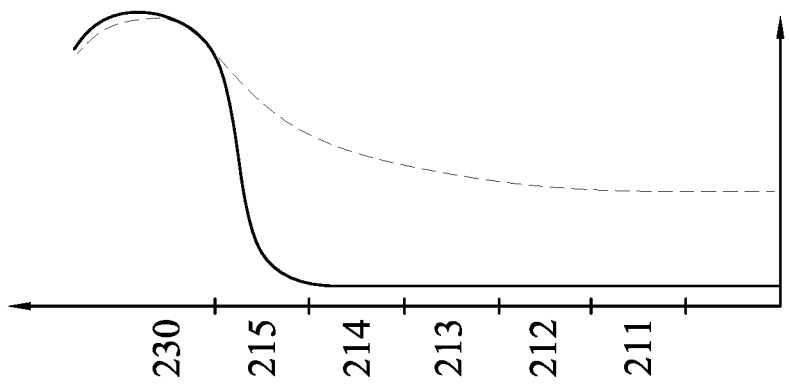
FIGS. 11A-11B respectively show graphs of concentrations of fluoride and aluminum according to some embodiments of the present disclosure.
Figure 11A:
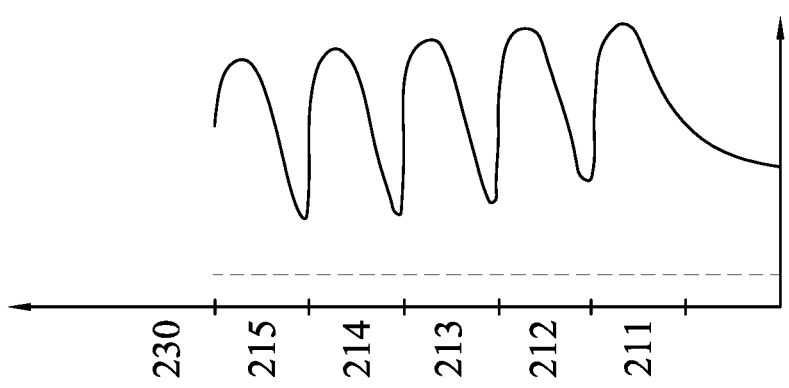

FIG. 11A shows a graph of concentrations of fluorine at different heights of the work function stack formed by some embodiments of the present disclosure (shown by the solid line), and concentrations of fluorine at different heights of the work function stack formed by traditional methods (shown by the dotted line). In the work function stack formed by traditional methods, fluorine is absent throughout the work function layers 211-215. In the work function stack formed by embodiments of the present disclosure, concentrations of fluorine are high at top portions of each of the work function layers 211-215, due to diffusion of fluorine from the precursor deposited on top surfaces of the work function layers 211-215 during the process of forming the work function stack.

FIG. 11B shows a graph of concentrations of aluminum at different heights of the work function stack formed by some embodiments of the present disclosure (shown by the solid line), and concentrations of aluminum at different heights of the work function stack formed by traditional methods (shown by the dotted line). In the work function stack formed by traditional methods, concentrations of aluminum is high at the metal gate electrode 230 and at the top of the work function stack, due to diffusion of aluminum from the metal gate electrode 230 made of titanium aluminum deposited at the top of the work function stack, and is present throughout the entire height of the work function stack due to diffusion. In the work function layers 211-215 formed by some embodiments of the present disclosure, concentrations of aluminum is significantly reduced to due blocking of aluminum diffusion by fluorine and/or by the protective layer.

The present disclosure provides a protective layer covering a work function layer, so as to improve the resistance and the work function of the work function layer by removing an oxidized portion of the work function layer, and blocking aluminum from diffusing into the work function layer by the presence of fluorine.

According to some embodiments of the present disclosure, a method includes forming a high-k dielectric layer over a semiconductor substrate having a first trench and a second trench; depositing a barrier layer over the high-k dielectric layer, depositing a work function layer over the barrier layer; patterning and removing the work function layer from the second trench; reacting a precursor with the work function layer in the first trench and reacting the precursor with the barrier layer in the second trench; and removing reaction products between the precursor and the work function layer, and reaction products between the precursor and the barrier layer, by using an inert gas.

According to some embodiments of the present disclosure, a method includes forming a high-k dielectric layer over a semiconductor substrate; depositing a work function layer over the high-k dielectric layer; reacting a precursor with the work function layer; and removing reaction products between the precursor and the work function layer by using an inert gas.

According to some embodiments of the present disclosure, a semiconductor device includes a high-k dielectric layer over a semiconductor substrate, wherein the semiconductor substrate has a fin structure; a first work function layer over the high-k dielectric layer; a protective layer over the first work function layer; and a metal gate electrode over the protective layer and across the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a high-k dielectric layer over a semiconductor substrate having a first trench and a second trench;
    depositing a barrier layer over the high-k dielectric layer;
    depositing a work function layer over the barrier layer;
    patterning and removing the work function layer from the second trench; and
    reacting a fluoride-containing precursor with the work function layer in the first trench to remove an oxidized upper portion of the work function layer while remaining a non-oxidized lower portion of the work function layer, and reacting the fluoride-containing precursor with the barrier layer in the second trench to remove the barrier layer.

2. The method of claim 1, wherein reacting the fluoride-containing precursor with the work function layer in the first trench to remove the oxidized upper portion of the work function layer comprises:
    cyclically repeating reacting the fluoride-containing precursor with the oxidized upper portion of the work function layer; and
    removing reaction products of the fluoride-containing precursor and the oxidized upper portion of the work function layer by using an inert gas.

3. The method of claim 1, wherein the fluoride-containing precursor comprises tungsten fluoride, tantalum fluoride, titanium fluoride, or combinations thereof.

4. The method of claim 1, wherein the non-oxidized lower portion of the work function layer of the work function layer is made of titanium nitride, the oxidized upper portion of the work function layer is made of titanium oxide, and reacting the fluoride-containing precursor with the work function layer in the first trench is such that the fluoride-containing precursor reacts and selectively etches the oxidized upper portion of the work function layer.

5. The method of claim 1, wherein the barrier layer comprises tantalum nitride and tantalum oxynitride, and reacting the fluoride-containing precursor with the barrier layer in the second trench is such that the fluoride-containing precursor etches the barrier layer.

6. The method of claim 1, further comprising:
    after reacting the fluoride-containing precursor with the work function layer in the first trench to remove the oxidized upper portion of the work function layer, forming a tungsten fluoride layer over the non-oxidized lower portion of the work function layer.

7. The method of claim 1, further comprising:
    after reacting the fluoride-containing precursor with the work function layer in the first trench to remove the oxidized upper portion of the work function layer, forming a titanium aluminide layer over the non-oxidized lower portion of the work function layer.

8. A method, comprising:
    forming a semiconductor fin upwardly extending from a substrate;
    forming a plurality of dummy gate structures extending across the semiconductor fin;
    forming a plurality of gate spacers on opposite sidewalls of the plurality of dummy gate structures;
    removing first and second ones of the plurality of dummy gate structures to form first and second trenches between the gate spacers;
    depositing a first gate dielectric layer in the first trench and a second gate dielectric layer in the second trench;

depositing a first barrier layer over the first gate dielectric layer and a second barrier layer over the second gate dielectric layer;

forming a work function layer over the first barrier layer;

introducing a fluoride-containing precursor to the second barrier layer in the second trench and the work function layer in the first trench;

removing, using the fluoride-containing precursor, the second barrier layer to expose the second gate dielectric layer and an oxidized upper portion of the work function layer to expose a non-oxidized lower portion of the work function layer; and forming a first gate electrode in the first trench and a second gate electrode in the second trench.

9. The method of claim 8, wherein the fluoride-containing precursor comprises tungsten fluoride, tantalum fluoride, or titanium fluoride.

10. The method of claim 8, wherein introducing the fluoride-containing precursor to the second barrier layer and the work function layer is performed such that fluorine from the fluoride-containing precursor is diffused into the second gate dielectric layer and the first barrier layer.

11. The method of claim 8, wherein removing the second barrier layer and the oxidized upper portion of the work function layer is performing by a purge operation.

12. The method of claim 8, wherein the work function layer is made of titanium nitride.

13. The method of claim 8, wherein the second barrier layer is made of tantalum nitride.

14. The method of claim 8, further comprising:
after removing the oxidized upper portion of the work function layer, forming a tungsten fluoride layer over the non-oxidized lower portion of the work function layer.

15. The method of claim 8, further comprising:
after removing the oxidized upper portion of the work function layer, forming a titanium aluminide layer over the non-oxidized lower portion of the work function layer.

16. A method, comprising:
forming a semiconductor fin upwardly extending from a semiconductor substrate;
forming an inter-layer dielectric (ILD) layer over the semiconductor substrate;
forming first and second trenches in the ILD layer and exposing the semiconductor fin;
depositing a first high-k dielectric layer in the first trench and a second high-k dielectric layer in the second trench;
depositing a first tantalum-containing layer over the first high-k dielectric layer and a second tantalum-containing layer over the second high-k dielectric layer;
forming a titanium-containing layer over the first tantalum-containing layer;
removing, using a fluoride-containing precursor, the second tantalum-containing layer to expose the second high-k dielectric layer and an oxidized upper portion of the titanium-containing layer to expose a non-oxidized lower portion of the titanium-containing layer; and
forming a first gate electrode in the first trench and a second gate electrode in the second trench.

17. The method of claim 16, wherein the fluoride-containing precursor includes tungsten fluoride.

18. The method of claim 16, wherein removing, using the fluoride-containing precursor, the second tantalum-containing layer and an oxidized upper portion of the titanium-containing layer is preformed to remove reaction products of the fluoride-containing precursor, the oxidized upper portion of the titanium-containing layer, and the second tantalum-containing layer by using an inert gas.

19. The method of claim 16, further comprising:
after removing the oxidized upper portion of the titanium-containing layer, forming a tungsten fluoride layer over the non-oxidized lower portion of the titanium-containing layer.

20. The method of claim 16, further comprising:
after removing the oxidized upper portion of the titanium-containing layer, forming a titanium aluminide layer over the non-oxidized lower portion of the titanium-containing layer.

* * * * *